(12) United States Patent
Varnica et al.

(10) Patent No.: US 9,160,368 B1
(45) Date of Patent: *Oct. 13, 2015

(54) SYSTEMS AND METHODS FOR NEAR-CODEWORD DETECTION AND CORRECTION ON THE FLY

(71) Applicant: Marvell International Ltd., Hamilton (BM)

(72) Inventors: Nedeljko Varnica, San Jose, CA (US); Yifei Zhang, Milpitas, CA (US); Gregory Burd, San Jose, CA (US)

(73) Assignee: Marvell International Ltd., Hamilton (BM)

( * ) Notice: Subject to any disclaimer, the term of this patent is extended or adjusted under 35 U.S.C. 154(b) by 143 days.

This patent is subject to a terminal disclaimer.

(21) Appl. No.: 14/079,487

(22) Filed: Nov. 13, 2013

Related U.S. Application Data

(63) Continuation of application No. 13/728,524, filed on Dec. 27, 2012, now Pat. No. 8,601,328, which is a continuation of application No. 12/689,611, filed on Jan. 19, 2010, now Pat. No. 8,347,195.

(60) Provisional application No. 61/146,471, filed on Jan. 22, 2009.

(51) Int. Cl.
*H03M 13/11* (2006.01)
*H03M 13/37* (2006.01)
*H03M 13/00* (2006.01)

(52) U.S. Cl.
CPC ........ *H03M 13/1142* (2013.01); *H03M 13/114* (2013.01); *H03M 13/116* (2013.01); *H03M 13/1117* (2013.01); *H03M 13/1128* (2013.01); *H03M 13/1137* (2013.01); *H03M 13/1145* (2013.01); *H03M 13/3707* (2013.01); *H03M 13/6331* (2013.01); *H03M 13/6577* (2013.01)

(58) Field of Classification Search
CPC ..................... H03M 13/1117; H03M 13/1128; H03M 13/1137; H03M 13/114; H03M 13/1142; H03M 13/1145; H03M 13/116; H03M 13/3707; H03M 13/6331; H03M 13/6577
USPC .................. 714/785, 752, 780, 784, 799, 802
See application file for complete search history.

(56) References Cited

U.S. PATENT DOCUMENTS

| 4,782,490 A | 11/1988 | Tenengolts |
| 5,179,560 A | 1/1993 | Yamagishi et al. |

(Continued)

OTHER PUBLICATIONS

Dinoi et al., "Design of Variable-rate irregular LDPC Codes with Low Error Floor," IEEE, 647-651 (2005).

(Continued)

*Primary Examiner* — John J Tabone, Jr.

(57) ABSTRACT

Systems and methods are provided for enhancing the performance and throughput of a low-density parity check (LDPC) decoder. In some embodiments, the enhanced performance and throughput may be achieved by detecting and correcting near-codewords before the decoder iterates up to a predetermined number of iterations. In some embodiments, a corrector runs concurrently with the decoder to correct a near-codeword when the near-codeword is detected. In alternate embodiments, the corrector is active while the decoder is not active. Both embodiments allow for on-the-fly codeword error corrections that improve the performance (e.g., reducing the number of errors) without decreasing the throughput of the decoder.

36 Claims, 15 Drawing Sheets

(56) References Cited

U.S. PATENT DOCUMENTS

| | | | |
|---|---|---|---|
| 5,280,488 | A | 1/1994 | Glover et al. |
| 5,420,873 | A | 5/1995 | Yamagishi et al. |
| 5,610,929 | A | 3/1997 | Yamamoto |
| 5,659,557 | A | 8/1997 | Glover et al. |
| 5,680,340 | A | 10/1997 | Glover et al. |
| 5,875,200 | A | 2/1999 | Glover et al. |
| 6,640,327 | B1 | 10/2003 | Hallberg |
| 7,502,986 | B2 | 3/2009 | O'Neill et al. |
| 7,949,931 | B2 | 5/2011 | Lastras-Montano |
| 8,127,209 | B1 | 2/2012 | Zhang et al. |
| 8,196,016 | B1 | 6/2012 | Langner et al. |
| 8,301,984 | B1 | 10/2012 | Zhang et al. |
| 8,347,195 | B1 | 1/2013 | Varnica et al. |
| 2005/0144543 | A1 | 6/2005 | Choi et al. |
| 2005/0193320 | A1 | 9/2005 | Varnica et al. |
| 2005/0283707 | A1 | 12/2005 | Sharon et al. |
| 2010/0042897 | A1 | 2/2010 | Han et al. |
| 2011/0126075 | A1 | 5/2011 | Gunnam |
| 2011/0138253 | A1 | 6/2011 | Gunnam |

OTHER PUBLICATIONS

Lee et al., "Error Floors in LDPC Codes: Fast Simulation, Bounds and Hardware Emulation," IEEE ISIT 2008, 444-448 (2008).

Richardson, "Error Floors of LDPC Codes," Allerton Conference on Communication, Control and Computing, Monticello, Illinois, pp. 1-5 (2003).

Wadayama et al., "Gradient Descent Bit Flipping Algorithms for Decoding LDPC Codes," CS.IT, pp. 1-6 (2008).

J. Kliewer, K. S. Zigangirov, and D. I. Costello, Jr., On the minimum trapping distance of repeat accumulate codes, in Proc. 46th Annual Allerton Conference on Communication, Control, and Computing, Monticello, IL, Sep. 2008.

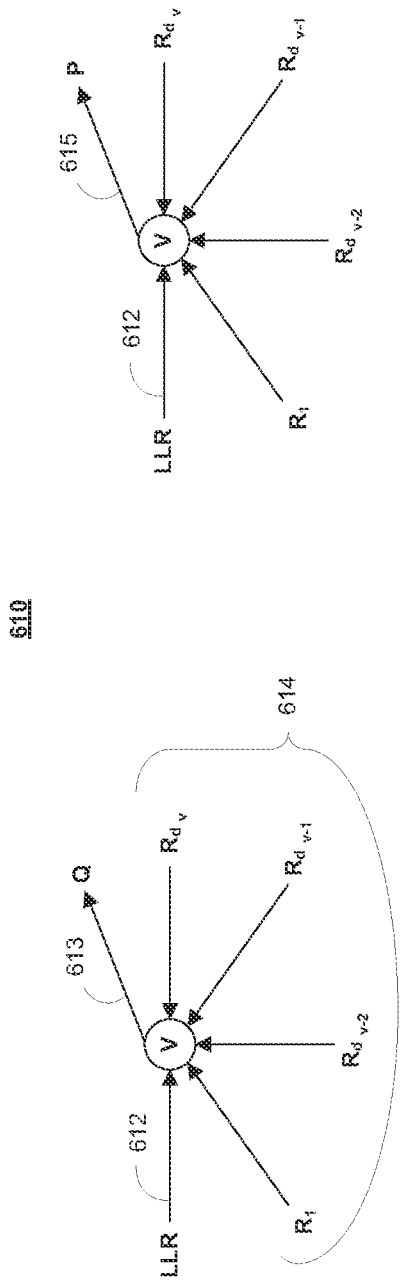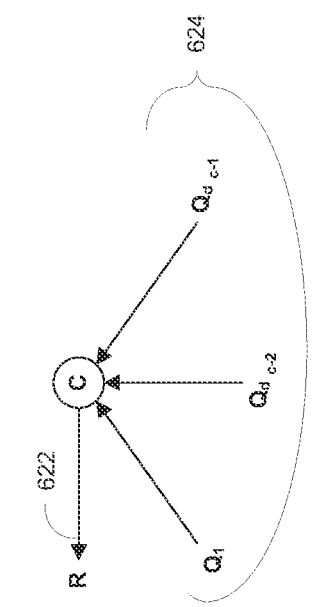
FIG. 6A
FIG. 6B

| Syndrome Weight | Syndrome Pattern | | Bit Pattern | |
|---|---|---|---|---|
| | Syndrome Circulant | Check Node | Variable Circulant | Variable Node |
| 2 | 0 1 | 0 63 | 0 2 10 43 87 | 1 2 7 13 20 |
| | 2 4 | 0 87 | 3 23 48 50 67 77 | 3 48 55 43 83 74 |
| 3 | 0 2 3 | 0 28 84 | 0 3 27 32 | 7 25 37 64 |
| ⋮ | ⋮ | ⋮ | ⋮ | |
| 4 | 0 0 1 3 | 0 29 68 89 | 2 7 12 22 47 50 76 | 37 84 35 1 2 7 36 |

FIG. 14

SYSTEMS AND METHODS FOR NEAR-CODEWORD DETECTION AND CORRECTION ON THE FLY

CROSS-REFERENCE TO RELATED APPLICATIONS

This application is a continuation of U.S. patent application Ser. No. 13/728,524, filed Dec. 27, 2012 (currently pending), which is a continuation of U.S. patent application Ser. No. 12/689,611, filed Jan. 19, 2010 (now U.S. Pat. No. 8,347, 195), which claims the benefit under 35 U.S.C. §119(e) of U.S. Provisional Application No. 61/146,471, filed Jan. 22, 2009 (now expired), the contents of which are hereby incorporated by reference herein in their entireties.

BACKGROUND OF THE PRESENT DISCLOSURE

This disclosure relates generally to data decoding, and more particularly to detecting and correcting near-codewords in iterative decoders for data encoded with a low-density parity check (LDPC) encoder.

An LDPC code is an error correcting code that may be used in the transmission of information through a noisy communications channel, with or without memory. A variety of LDPC decoding techniques may be used to recover and correct the information received from The channel, most of which are iterative in nature.

In the case of a memoryless channel, an LDPC decoder may directly receive log-likelihood-ratio (LLR) information, a bit reliability metric representative of the encoded data received from the channel, for use in the decoding operation. In the case of a channel with memory, a soft-in soft-out (SISO) channel detector, such as a soft output Viterbi algorithm (SOVA) detector, may be used in conjunction with the LDPC decoder. The decoding operation may alternate between use of the SISO channel detector and the LDPC decoder in order to decode the data. In particular, LLR information may be passed from the SISO channel detector to the LDPC decoder for use in the next LDPC decoding iteration and vice versa, in an iterative process that may be repeated, as desired, in order to improve data reliability.

LDPC codes may be represented by many different types of parity check matrices. The structure of an LDPC code's parity check matrix may be, for example, random, cyclic, or quasi-cyclic. LDPC codes defined by quasi-cyclic parity check matrices are particularly common and computationally efficient. These codes are known as quasi-cyclic low density parity check (QC-LDPC) codes.

A parity check matrix representative of a particular LDPC code may correspond to a bi-partite graph with check nodes and variable nodes. An LDPC decoder may decode received codewords using an iterative message passing algorithm, in which each iteration or sub-iteration includes two update steps involving the variable nodes and check nodes. (As used herein, the term "message" refers to a numerical value, usually representing an LLR.) In the first update step, messages may be passed from some (or all) check nodes to some (or all) variable nodes, and in the second update step, messages may be passed from some (or all) variable nodes to some (or all) check nodes.

An LDPC decoder may perform the update steps in accordance with a serial (layered) or flooding decoding schedule. In the flooding technique, all check nodes may be updated before a variable node may be updated and all variable nodes may be updated before a check node may be updated. In layered decoding, on the other hand, only those variable nodes necessary for updating a particular check node may be updated; or only those check nodes necessary for updating a particular variable node may be updated. An LDPC decoder that uses a layered update schedule for the message passing algorithm is herein referred to as a layered LDPC decoder.

Many iterative decoders currently iterate up to some predetermined number of iterations or until a correct codeword is detected. This, however, can be inefficient. For example, in some situations, near-codewords may arise that may never converge to a correct codeword even with significantly more iterations than the predetermined number of iterations.

Therefore, it would be desirable to provide LDPC decoders that can detect and correct near-codewords before the decoder iterates up to the predetermined number of iterations. Detecting and correcting the near-codewords may improve system performance and reduce the number of errors.

The background description provided herein is for the purpose of generally presenting the context of the disclosure. Work of the inventors hereof, to the extent the work is described in this background section, as well as aspects of the description that may not otherwise qualify as prior art at the time of filing, are neither expressly nor impliedly admitted as prior art against the present disclosure.

SUMMARY OF THE DISCLOSURE

Methods and systems for determining whether an iterative decoder for decoding a codeword is in a trapped error state are disclosed that may improve the performance (e.g., reducing the number of errors) without decreasing the throughput of the decoder.

In some embodiments, a decoder is provided that is capable of iterating to compute decision values for a plurality of check nodes and a plurality of variable nodes. In some embodiments, the decoder is further capable of determining a syndrome value related to the plurality of check nodes. In some embodiments, an operator is provided that is capable of incrementing a counter when the newly computed value and the previously computed value are equal. In some embodiments, an incrementor is provided that is capable of incrementing a counter when the newly computed value and the previously computer value are equal. In some embodiments, a decider is provided that is capable of determining whether the decoder has reached a trapped error state based on the value of the counter and the syndrome value.

In some embodiments, a corrector is provided that is capable of activating a correction operation when the decoder is determined to have reached the trapped error state. In some embodiments, the correction operation is active concurrently with the decoder. In some embodiments, the decoder is halted when the correction operation is activated.

In some embodiments, a near-codeword corrector that is capable of performing the correction operation is provided. In some embodiments, the near-codeword corrector comprises a table capable of maintaining a plurality of known error patterns associated with a plurality of known near-codewords. In some embodiments, the near-codeword corrector further comprises a receiver that receives a newly detected near-codeword from the decoder. In some embodiments, the near-codeword corrector further comprises a calculator that is capable of determining a error pattern associated with the newly detected near-codeword. In some embodiments, the near-codeword corrector further comprises a selector that is capable of comparing the determined error pattern to a known error pattern.

In some embodiments, the near-codeword corrector further comprises an error position generator that is capable of determining a shift relationship between the determined error pattern and the known error pattern. In some embodiments, the near-codeword corrector further comprises an error bit flipper capable of flipping a value of a bit in a bit location in the newly detected near-codeword, wherein the bit location is determined based on the shift relationship.

BRIEF DESCRIPTION OF THE FIGURES

The above and other aspects and advantages of the present disclosure will be apparent upon consideration of the following detailed description, taken in conjunction with the accompanying drawings, in which like reference characters refer to like parts throughout, and in which:

FIG. 6A shows a graphical illustration of update rules for variable nodes in a message passing algorithm in accordance with some embodiments;

FIG. 6B shows a graphical illustration of update rules for check nodes in a message passing algorithm in accordance with some embodiments;

FIG. 14 shows an illustrative sample of a table that stores information related to known near-codewords in accordance with some embodiments.

DETAILED DESCRIPTION OF THE DISCLOSURE

Systems and methods are provided for enhancing the performance and throughput of a low-density parity check (LDPC) decoder. In some embodiments, the enhanced performance and throughput may be achieved by detecting and correcting near-codewords before the decoder iterates up to a predetermined number of iterations. In some embodiments, a corrector runs concurrently with the decoder to correct a near-codeword when the near-codeword is detected. In alternate embodiments, the corrector is active while the decoder is not active. Both embodiments allow for on-the-fly codeword error corrections that improve the performance (e.g., reducing the number of errors) without decreasing the throughput of the decoder.

As used herein, "information" and "data" refer to any unit or aggregate of energy, signals, or values that contain some meaning or usefulness. Encoding may generally refer to the process of generating data in a manner that facilitates subsequent detection and/or correction of errors in the data, while decoding may generally refer to the counterpart process of detecting and/or correcting the errors. The elements of a coding system that perform encoding and decoding are likewise referred to as encoders and decoders, respectively.

Figure 1:
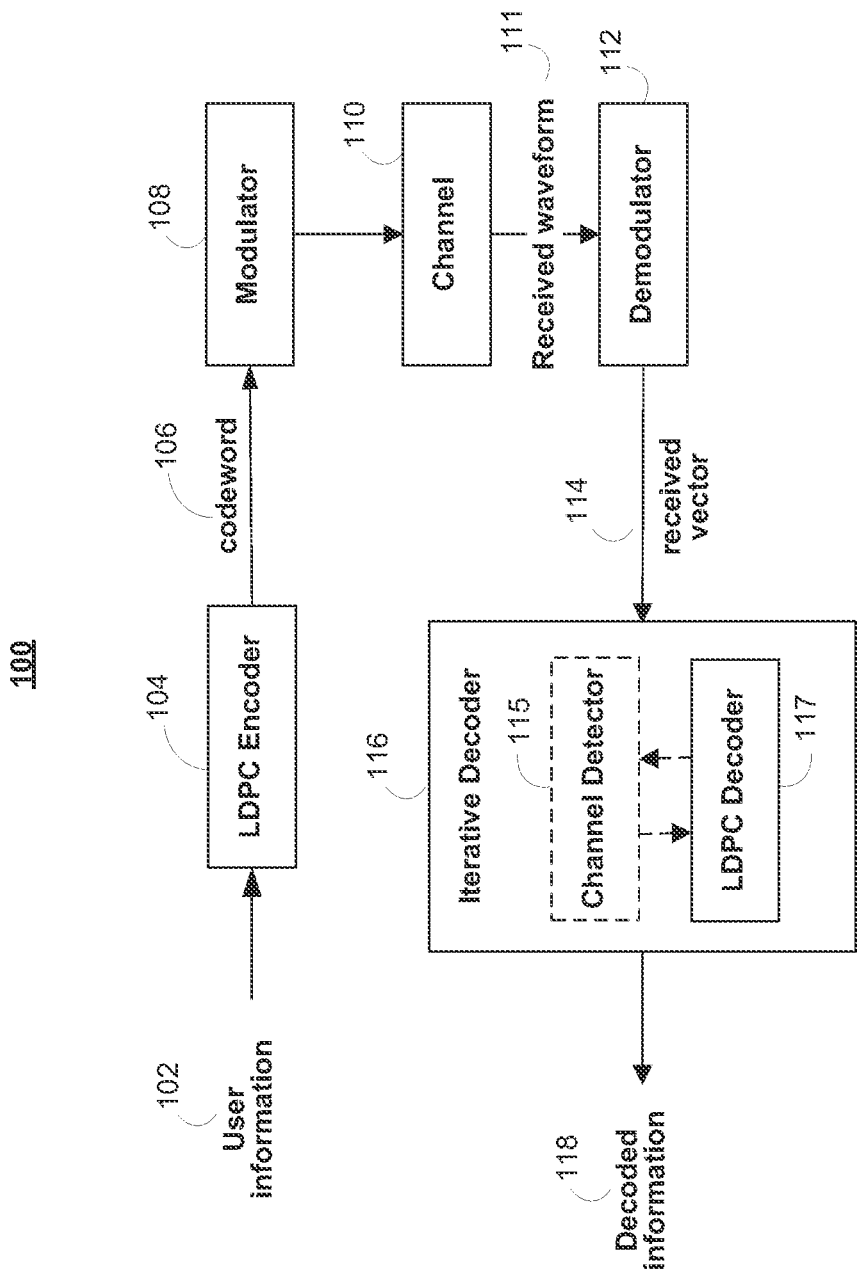
FIG. 1 shows an illustrative block diagram of an error-correcting communication/storage system in accordance with some embodiments.

FIG. 1 shows an illustrative communication or data storage system 100 that utilizes error-correcting low density parity check (LDPC) codes for achieving reliable communication or storage in accordance with some embodiments. Generally, user information 102 is encoded through LDPC encoder 104. User information 102, often referred to as the message information or a message vector, may be grouped into units of k symbols, where each symbol may be binary, ternary, quaternary, or any other suitable type of data. However, for simplicity, embodiments of the present disclosure will be described in terms of binary bits. The result of encoding user information 102 is codeword 106, also denoted as $\underline{c}$. Codeword 106 may be of a predetermined length, which may be referred to as n, where $n \geq k$.

In one implementation, codeword 106 is passed to a modulator 108. Modulator 108 prepares codeword 106 for transmission on channel 110. Modulator 108 may use phase-shift keying, frequency-shift keying, quadrature amplitude modulation, or any suitable modulation technique to modulate codeword 106 into one or more information-carrying signals. Channel 110 may represent media through which the information-carrying signals travel. For example, channel 110 may represent a wired or wireless medium in a communication system, or an electrical (e.g., RAM, ROM), magnetic (e.g., a hard disk), or optical (e.g., CD, DVD or holographic) storage medium in which the information-carrying signals may be stored.

Due to interference signals and other types of noise and phenomena, channel 110 may corrupt the waveform transmitted by modulator 108. Thus, the waveform received by demodulator 112, received waveform 111, may be different from the originally transmitted signal waveform. Received waveform 111 may be demodulated with demodulator 112. Demodulator 112 may demodulate received waveform 111 with filters, multiplication by periodic functions, or any suitable demodulation technique corresponding to the type of modulation used in modulator 108. The result of demodulation is received vector 114, which may contain errors due to channel corruption.

Received vector 114 may then be processed by iterative decoder 116. Iterative decoder 116 may be used to correct or detect errors in received vector 114. In some embodiments, iterative decoder 116 may include a trapping set detector and a near-codeword corrector that can detect and correct, respectively, trapping sets and/or near-codewords. Embodiments of trapping set detectors and near-codeword correctors are discussed further below with regard to FIGS. 9-15. Iterative decoder 116 may include an LDPC decoder 117 and, in some embodiments, a channel detector 115. Iterative decoder 116 may use an iterative message passing algorithm to correct or detect errors in received vector 114 in order to output decoded information 113.

Herein, a channel iteration refers to an iteration between a channel detector and a decoder. For example, a channel iteration may refer to the repetitions of information passing between channel detector 115 and LDPC decoder 117. A LDPC iteration refers to iterations within an LDPC decoder (e.g., a flooding decoder or a layered decoder), for example, repetition of calculations within LDPC decoder 117. The processing of a layer of a layered LDPC decoder is herein referred to as a sub-iteration. Examples for detecting and correcting trapped error states are described herein in terms of one ox more types of iteration (e.g., channel iteration, LDPC iteration, or sub-iteration), however, it should be noted that such examples are made for illustrative purposes and may be apply to other types of iterations without departing from the scope of the disclosure. For example, an example described in terms of a sub-iteration may equally apply to LDPC iterations without departing from the scope of the disclosure.

Figure 2:
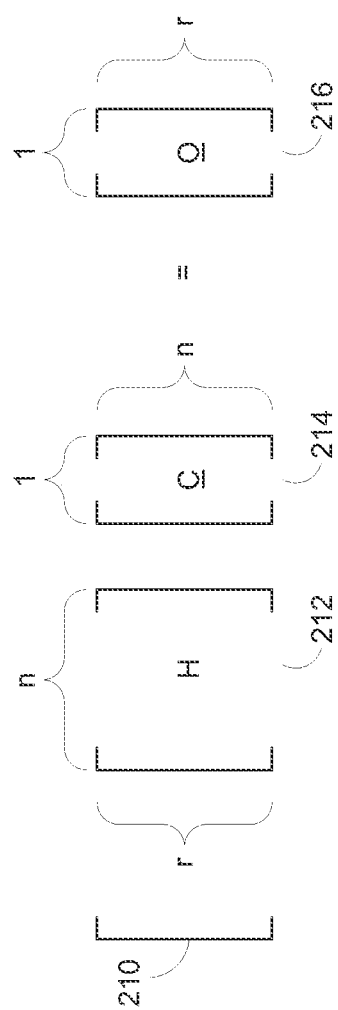
FIG. 2 shows an illustrative example of properties of a codeword in accordance with some embodiments.

FIG. 2 shows an illustrative example of the properties of codeword 106 of FIG. 1 in accordance with some embodiments. The LDPC codes defined by LDPC encoder 104 and iterative decoder 116 of FIG. 1 are conventionally represented by mathematical vector models. In particular, an LDPC code may be described by its parity check matrix H. Equation 210 illustrates parity check matrix 212. Parity check matrix 212 may be of size [r×n], corresponding to codewords of length n and syndromes of length r. Codewords may be, for example, n-length codeword 106 or n-length received vector 114 of FIG. 1. Syndrome length r may satisfy the inequality r≥n−k and where k is the length of the information being encoded (e.g., length of user information 102 of FIG. 1).

When parity check matrix 212 is multiplied by codeword 214, the result is zero-vector 216, which is a vector of size [r×1] where all elements equal zero. Parity check matrix 212 has a maximum column weight (cw) and a maximum row weight (rw), each defined to be the maximum of the set of the number of nonzero entries in each column and each row, respectively, of parity check matrix 212. Parity check matrix 212 is not unique, and may be chosen, for example, to be computationally convenient and/or to maximize the number of errors corrected by iterative decoder 116. As discussed in relation to FIG. 1, codeword 214 may be decoded in iterative decoder 116 to produce decoded information 118 of FIG. 1.

Figure 3:
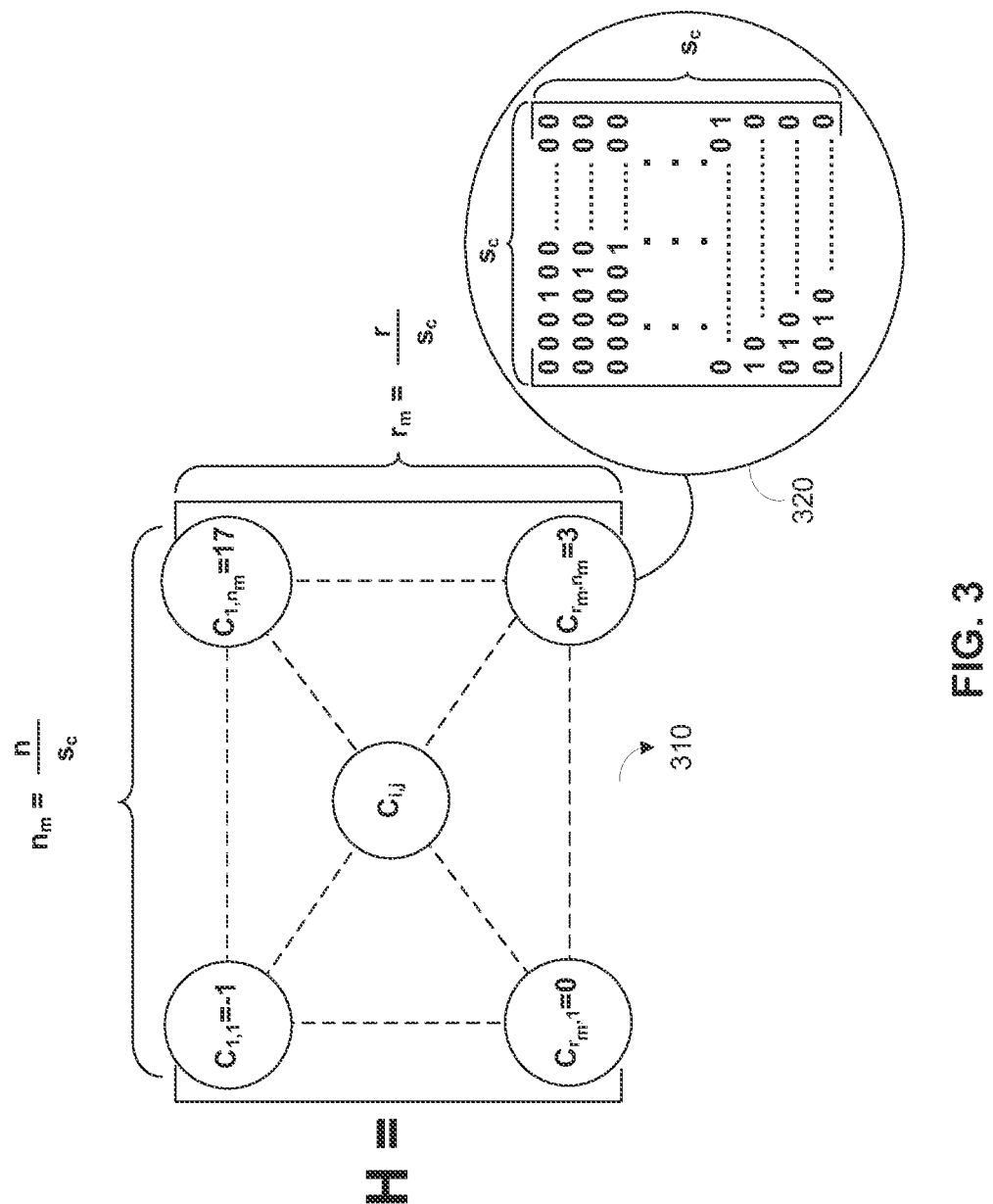
FIG. 3 shows an illustrative example of a parity check matrix in accordance with some embodiments.

FIG. 3 shows an illustrative example of parity check matrix 310 in accordance with some embodiments. In some implementations of LDPC codes, it may be desirable for storage and processing to have quasi-cyclic code representations. A quasi-cyclic code representation is defined by the characteristic that the parity check matrix for that particular code is quasi-cyclic. A quasi-cyclic parity check matrix is made up of circular submatrices known as circulants. Circulant 320 is one such matrix. Circulant 320 is a square matrix—i.e., circulant 320 has the same number of rows as columns. This number is commonly referred to as the circulant size $S_c$. In addition, circulants have the property that for any given positive integer $M \leq S_c$, the rows or columns of the circulant matrix may be cyclically shifted by M positions to obtain another circulant. Circulant 320 may be one of many circulants of the same size that comprise the parity check matrix 310. For brevity, the term "non-zero circulant" is used herein to refer to any circulant matrix that is not the all-zero matrix.

If a quasi-cyclic representation of a parity check matrix is used, then the implementation of LDPC encoder 104 of FIG. 1 and of iterative decoder 116 of FIG. 1, may be significantly simplified. One reason for this is that parity check matrix 310 may be stored efficiently and compactly, since only the first row or column of each circulant matrix needs to be stored in order to generate the entire circulant. Furthermore, parallelization in the encoder and decoder may be achievable with simple shifting operations, since adjacent rows (or adjacent columns) corresponding to the same circulant are cyclic shifts of each other.

Figure 4A:
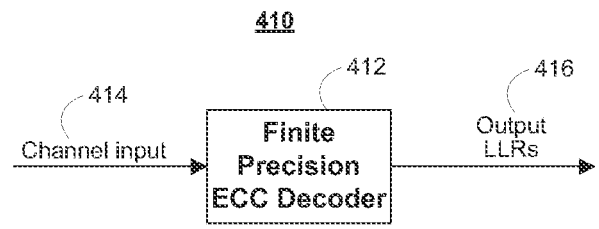
FIG. 4A shows a simplified block diagram of an iterative decoder used for decoding a codeword in channels without memory in accordance with some embodiments.

FIG. 4A shows a simplified block diagram of an iterative decoder that may be used for decoding a codeword in channels without memory in accordance with some embodiments. An iterative decoder for use with channels without memory may include finite precision error correcting code (ECC) decoder 412. Received vector 114 from channel 110 of FIG. 1 may be passed as channel input 414 to ECC decoder 412 for use in the decoding operation. ECC decoder 412 may calculate a log-likelihood-ratio (LLR) message (also known as soft information). For example, ECC decoder 412 may compute the LLR message using the equation $$LLR(b_i) = \log\left(\frac{P(b_i = 0)}{P(b_i = 1)}\right)$$

for each i, where $b_i$ may represent the $i^{th}$ bit in received vector 114 of FIG. 1. ECC decoder 412 may use the computed LLR messages in the message passing algorithm, which will be discussed further below. ECC decoder 412 may then output LLRs 416 based on the output of the message passing algorithm.

Figure 4B:
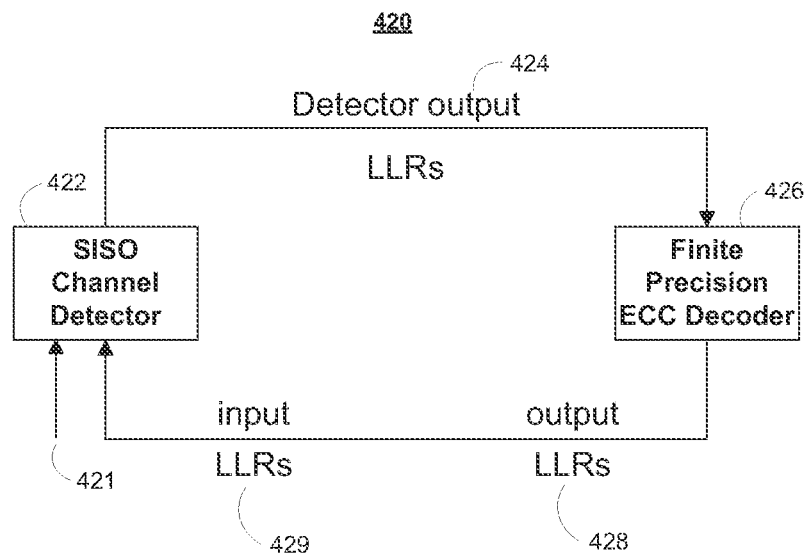
FIG. 4B shows a simplified block diagram of an iterative decoder used for decoding a codeword in channels with memory in accordance with some embodiments.

FIG. 4B shows a simplified block diagram of an iterative decoder used for decoding a codeword in channels with memory in accordance with some embodiments. An iterative decoder for use with channels with memory may include soft-input soft-output (SISO) channel detector 422, and ECC decoder 426. In performing iterative decoding, an iterative decoder may alternate between use of SISO channel detector 422 and ECC decoder 426. The information from an iteration of SISO channel detector 422 may be passed to the SCC decoder 426 for use in the next ECC decoding iteration, and vice versa. Through this iterative process, data reliability may be improved.

In each iteration of the process, received vector 114 from channel 110 of FIG. 1 may be passed as channel input 421 to SISO channel detector 422. SISO channel detector 422 may then use a soft output Viterbi algorithm (SOVA) or a Bahle, Cocke, Jelinek, and Reviv (BCJR) algorithm and channel input 421 to produce detector output LLRs 424 (also referred to as S type messages, or more generally, soft information). Detector output LLRs 424 may then be passed as input to ECC decoder 426 for use in the decoding operation. ECC decoder 426 may use detector output LLRs 424 to compute ECC decoder 426 output LLRs 428 (also referred to as Le type messages). ECC decoder 426 output LLRs 428 may be passed as input LLRs 429 to SISO channel detector 422.

Figure 5:
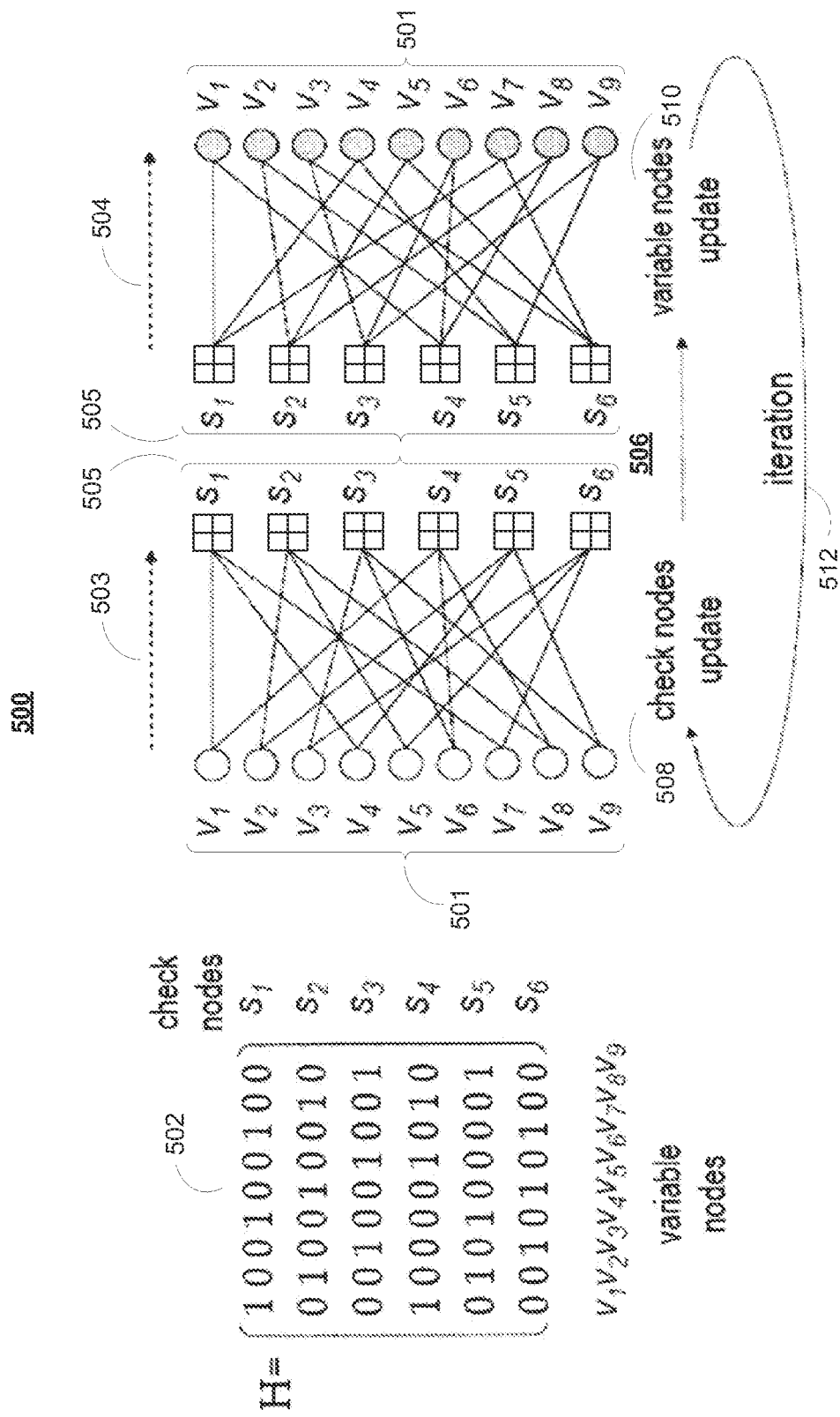
FIG. 5 shows a graphical illustration of a parity check matrix and an iterative message passing algorithm corresponding to the parity check matrix in accordance with some embodiments.

FIG. 5 shows graphical illustration 500 of a parity check matrix and an iterative message passing algorithm corresponding to the parity check matrix in accordance with some embodiments. An LDPC code may be graphically represented by a Tanner graph, a bipartite graph showing the relationship between an LDPC code's codeword bits and parity check constraints. The advantages of using a Tanner graph of an LDPC code may include access to efficient graph-based message passing algorithms for decoding. There are two types of nodes shown in Tanner graphs 503 and 504. Variable nodes 501 represent each position in codeword 106 of FIG. 1 and are denoted by circles. Thus, there may be n variable nodes. Variable nodes may also be referred to as symbol or bit nodes. Check nodes 505 represent each syndrome (parity check equation) that should satisfy the parity check constraints of the LDPC code. For example, there may be n–k check nodes, wherein k is the number of symbols. Check nodes are denoted by squares.

Tanner graphs 503 and 504 correspond to parity check matrix 502. The check nodes and variable nodes of Tanner graphs 503 and 504 respectively correspond to the rows and columns of parity check matrix 502. The undirected edges connecting check nodes with variable nodes correspond to the non-zero entries of parity check matrix 502. In other words, parity check matrix 502 may be the adjacency matrix of Tanner graphs 503 and 504. For example, the 1 at the (1,1) location and the 0 at the (1,2) location of parity check matrix 502 indicate that there is an edge between check node $S_1$ and variable node $V_1$, and that there is no edge between check node $S_1$ and variable node $V_2$, respectively. Therefore, if there are $d_v$ "1"'s in a given column of parity check matrix 502, then there are $d_v$ edges emanating from the variable node corresponding to that column. Equivalently, the variable node corresponding to that column may have a degree of $d_v$. Similarly, if there are $d_c$ "1"'s in some given row of parity check matrix 502, then there may be $d_c$ edges emanating from the check node corresponding to that row. Equivalently, the check node corresponding to that row may have a degree of $d_c$.

The check nodes (e.g., check nodes 505) of a Tanner graph may either be satisfied or unsatisfied, where a satisfied node has a binary value of 0 and an unsatisfied node has a binary value of 1. A check node is satisfied (i.e., equal to 0), if the values of the variable nodes connected to the check node sum to an even number. In other words, the value of each check node may be equal to the sum modulo two of the value of the variable nodes to which it is connected. For example, check node $S_2$ of Tanner graphs 503 and 504 may be satisfied if the values of variable nodes $V_2$, $V_5$, and $V_8$ sum to an even number. The parity check constraints of LDPC codes are chosen such that an unsatisfied check node indicates that at least one of the variable nodes connected to it may be in error. Thus, the value of the check nodes (or equivalently, the value of the syndrome produced by parity check matrix 502) may provide a parity check on each codeword received or decoded by an LDPC decoder (i.e., LDPC decoder 117 of FIG. 1), thereby providing error correction capability to communication or storage system 100 of FIG. 1.

An iterative two-step decoding algorithm known as a message passing algorithm 506 may be employed by, for example, LDPC decoder 117 of FIG. 1 to decode a received codeword. In the first step of message passing algorithm 506, all or some of check nodes 505 may update based on messages received from all or some of variable nodes 501. In the second step of message passing algorithm 506, all or some of variable nodes 501 may update based on messages received from all or some of check nodes 505. The process may be repeated until either the codeword has been decoded or until a threshold number of iterations or sub-iteration has been reached.

The messages used in message passing algorithm 506 may be log-likelihood-ratio (LLR) messages, also known as soft information. Iterative decoder 116 may calculate the LLR messages for use in iterative message-passing algorithm 506 to correct or detect errors in a received codeword (i.e., received vector 114). Prior to the first iteration of message passing algorithm 506, for example, each of the variable nodes 501 may receive an LLR message based on information from received vector 114 of FIG. 1. These LLR messages may be computed using the equation $$LLR(b_i) = \log\left(\frac{P(b_i = 0)}{P(b_i = 1)}\right)$$

for each i, where $b_i$ may represent the $i^{th}$ bit in received vector 114.

An LDPC decoder may perform the update steps of message passing algorithm 506 in accordance with a serial (layered) or flooding decoding schedule. In some embodiments, for example, when using some flooding techniques, all check nodes should be updated before a variable node may be updated and all variable nodes should be updated before a check node may be updated. In layered decoding, only those check nodes necessary for updating a particular variable node may be updated, and only those variable nodes necessary for updating a particular check node may be updated.

Tanner graphs 503 and 504 may be used to illustrate message passing algorithm 506 as employed by a layered LDPC decoder (e.g., LDPC decoder 117 of FIG. 1). The message passing algorithm may perform several rounds (iterations or sub-iterations) of message updates in accordance with the structure of the Tanner graph associated with the parity check matrix (e.g., parity check matrix 502) of the LDPC code to be decoded. In layered LDPC decoding, each sub-iteration 512 of message passing algorithm 506 may include processing several check nodes. These check nodes may be grouped into layers, which may represent physical locations in memory, such that each sub-iteration 512 may process a group of check nodes belonging to the same layer.

For example, in a first sub-iteration, some of the check nodes 505 (for example, check nodes $S_1$ and $S_2$) may receive messages from some of the variable nodes 501 to which they are connected. Check nodes $S_1$ and $S_2$ may then perform update 508 by carrying out computations based on the messages that they receive and a set of update rules. Then, check nodes $S_1$ and $S_2$ may send messages to the variable nodes to which they are connected. The variable nodes connected to check nodes $S_1$ and $S_2$ (i.e. variable nodes $V_1$, $V_4$, $V_7$ and variable nodes $V_2$, $V_5$ and $V_8$) may then perform update 510 by carrying out computations based on the messages that they receive and a set of update rules.

Sub-iteration 512 may be repeated until either the codeword has been decoded or until a threshold number of sub-iterations has been reached. As discussed above, the messages may correspond to LLR values. The messages that are sent during each step of each iteration or sub-iteration of message passing algorithm 506 may depend on the update rules and the scheduling of the update steps, which will be discussed further below.

FIG. 6A shows graphical illustration 610 of update rules for variable nodes in message passing algorithm 506 of FIG. 5 in accordance with some embodiments. For decoders operating in channels without memory, prior to the first iteration of message passing algorithm 506, each of the variable nodes 501 of FIG. 5 may compute LLR message 612 based on information from received vector 114 in FIG. 1. For decoders operating in channels with memory, prior to the first iteration of message passing algorithm 506, each of the variable nodes 501 of FIG. 5 may compute LLR message 612 based on information received from SISO channel detector 322 of FIG. 3B.

Each of variable nodes 501 of FIG. 5 may have $d_v$ edges emanating from it in Tanner graphs 503 and 504 of FIG. 5.

Each of these edges may connect a variable node to a check node in Tanner graphs 503 and 504 of FIG. 5. For each iteration of the message passing algorithm 506 of FIG. 5, each variable node may receive $d_v$ messages 614 each from a different check node to which it is connected. Each of messages 614 sent from the check nodes to the variable nodes may be labeled as a R type message. For example, these messages are labeled $R_1$ through $R_d$, in graphical illustration 610.

In the layered iterative decoder, in the first layer, some number of check nodes may be processed and the corresponding neighboring variable nodes are updated. Then in the next layer, the next set of check nodes may be processed and the corresponding variable nodes may be updated. Each layer may be processed in this manner.

There may be several ways to perform (schedule) message update steps in the layered decoder. For example, using initial LLR messages 612, and each of the R type messages 614, each of the variable nodes 501 of FIG. 5 may compute Q type message 613 (also known as a bit-to-check message) based on the equation:

$$Q = LLR + \sum_{j=1}^{d_v-1} R_j.$$

This Q type message may be sent to the check nodes to which the variable node is connected. Similarly, message update steps may be performed to compute P type message 615 (also known as an a-posteriori probability (APP) message). Using initial LRR message 612 and each of the R type messages 614, each of the variable nodes 501 of FIG. 5 may compute a P type message 615 based on the equation:

$$P = LLR + \sum_{j=1}^{d_v} R_j.$$

In addition, each of the variable nodes 501 of FIG. 5 may also compute an extrinsic ($LLR_{EXT}$) message based on the equations:

$$LLR_{APP}(v) = LLR + \sum_{j=1}^{d_v} R_j$$

and $LLR_{EXT}(v) = LLR_{APP}(v) - LLR$. The scheduling of update steps will be discussed further below.

FIG. 6B shows graphical illustrations 620 of update rules for check nodes in message passing algorithm 506 of FIG. 5 in accordance with some embodiments. Each of the check nodes 505 of FIG. 5 may have $d_c$ edges emanating from it in Tanner graphs 503 and 504 of FIG. 5. Each of these edges may connect a check node to a variable node in Tanner graphs 503 and 504 of FIG. 5. For each iteration of the message passing algorithm 506 of FIG. 5, each check node may receive $d_c$ messages 624 each from a different variable node to which it is connected. Messages sent from the variable nodes to the check nodes may be labeled as Q type messages. Depending on the scheduling of the update steps, either Q type messages may be stored in the iterative decoder's memory or P type messages may be stored in the iterative decoder's memory.

Each of the check nodes 505 of FIG. 5 may compute R message 622, using a min approximation. Using each of the Q type messages 624, each of the check nodes 505 of FIG. 5 may compute R type messages 622 based on the equations $$\tanh\left(\frac{R}{2}\right) = \prod_{k=1}^{d_v-1} \tanh\left(\frac{Q_k}{2}\right)$$

which may be approximated using min approximation $$R \approx \min(Q_k, \ldots, Q_{d_v-1}) \prod_{k=1}^{d_v-1} \text{sign}(Q_k).$$

The $Q_k$ messages (i.e. a number k of Q type messages) may be read directly from the memory of the iterative decoder or may be reconstructed. The $Q_k$ messages may be reconstructed from the $P_k$ messages (i.e. a number k of P type messages) and the previous R type messages that may be read from the memory of the iterative decoder. These newly computed R messages may be sent to each of the variable nodes to which the check node is connected.

Figure 7:
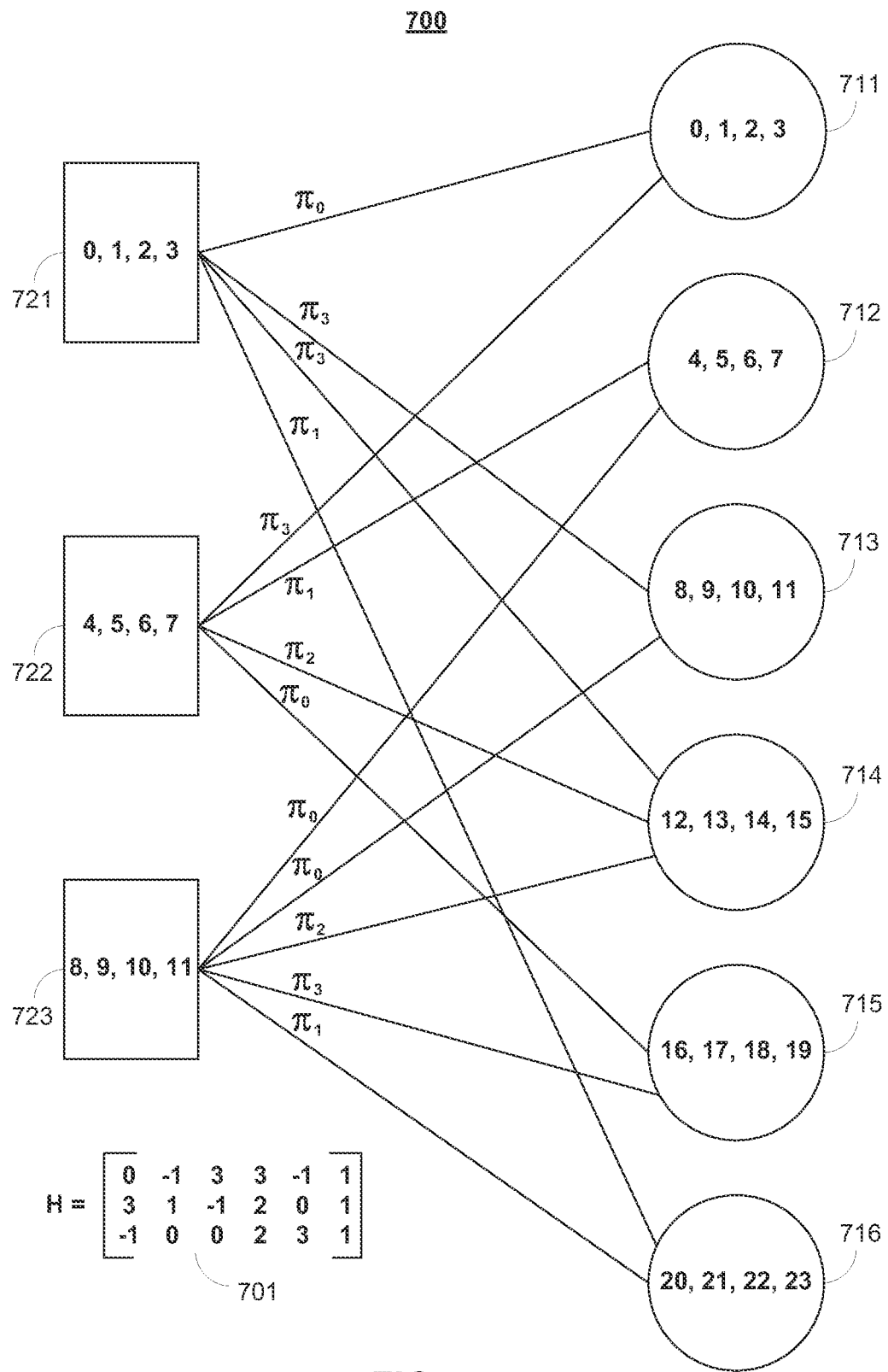
FIG. 7 shows a graphical illustration of a parity check matrix in a mother matrix representation and a bi-partite graph illustrating the use of parallel processing in layered LDPC decoding in accordance with some embodiments.

FIG. 7 shows graphical illustration 700 of a parity check matrix 701 in a mother matrix representation and a bi-partite graph illustrating the use of parallel processing in layered LDPC decoding, in accordance with some embodiments. Each entry of parity check matrix 701 corresponds to a circulant shifted by the amount shown, wherein the value −1 represents an all-zero circulant. Graph 700 includes grouped check nodes 721, 722, and 723 and grouped variable nodes 711, 712, 713, 714, 715, and 716. The edges between the grouped check nodes and the grouped variable nodes may represent possible permutations, $\pi_{ij}$, of a plurality of edges generated based on a non-zero circulant in parity check matrix 701. In other words, the non-zero circulant may be the adjacency matrix of the sub-graph of connections between each group of check nodes and each group of variable nodes. In layered LDPC decoding, particular layers or groups of check nodes may update in parallel. To accomplish this, check nodes associated with a particular row in parity check matrix 701 may be grouped together. This process may result in grouped check nodes 721, 722, and 723. For example, check nodes associated with the first four rows of the parity check matrix, labeled 0, 1, 2, and 3, may be combined into grouped check nodes 721 and may be updated at substantially the same time (i.e. processed in parallel, for example, in the first layer of decoding). Similarly, variable nodes associated with a particular column in parity check matrix 701 may be grouped together. This process may result in grouped variable nodes 711, 712, 713, 714, 715, and 716.

Processing for and updating of all check nodes in grouped check nodes 721, 722, or 723 may be done in parallel. Similarly, processing for and updating of all variable nodes in grouped variable nodes 711, 712, 713, 714, 715, and 716 may also be done in parallel. The processing of neighboring grouped check nodes and grouped variable nodes in this way may allow for reduced-complexity circular shifter design. To decode an LDPC code using layered decoding, the fundamental principles of message passing algorithm 506 of FIG. 5 may be used.

Figure 8:
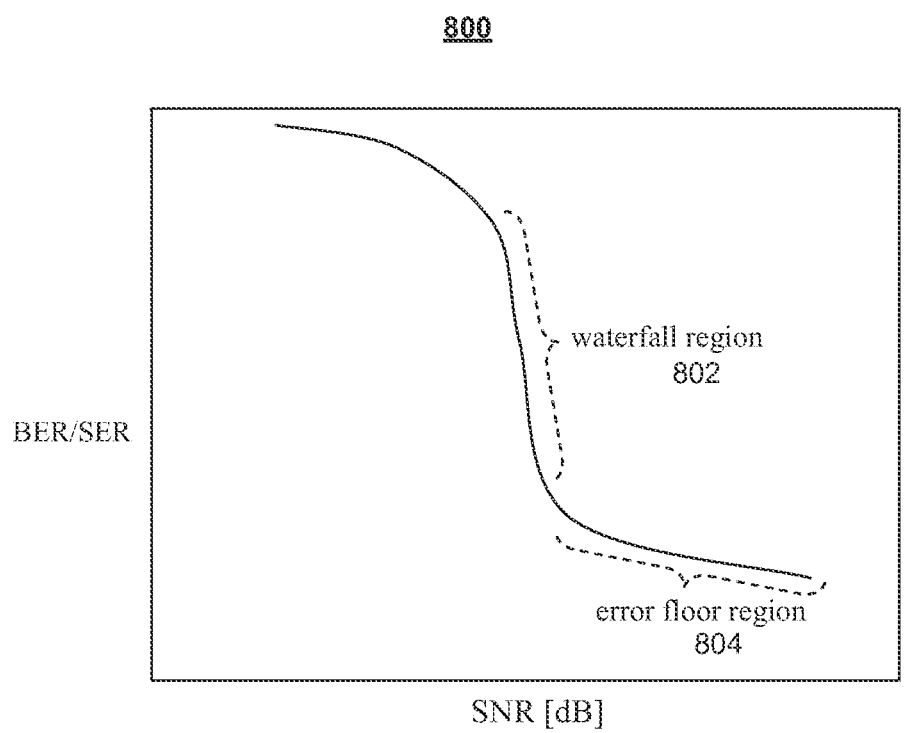
FIG. 8 shows an illustrative graph of regions of error at various signal-to-noise ratios in accordance with some embodiments.

FIG. 8 shows an illustrative graph of regions of error at various signal-to-noise-ratios (SNRs) in accordance with some embodiments. As mentioned previously, the performance capability of LDPC codes, as described by a mapping of bit error rate (BER)/symbol error rate (SER) to SNR, generally comprises two regions of operation: the waterfall region and the error floor region. FIG. 8 shows an exemplary LDPC performance curve 800 with waterfall region 802 and error floor region 804. In error floor region 804, the BER/SER of the LDPC code disadvantageously asymptotes to a lower limit. Because the normal operating conditions for a communication/storage channel may be in error floor region 804, lowering the error floor may improve the performance of the LDPC code in terms of BER/SER. In some applications, such as data storage, the required SER may be very low, for example, 1e-12. Many systems may not be able to approach these low levels of SER because their error floors are too high.

In some embodiments, the error floor may be lowered by the detection and correction of trapping sets and/or near-codewords, and hence, the performance of the systems may improve. The detection and correction of the most dominant near-codewords may significantly lower the error floor. Near-codewords herein are vectors that are relatively close to a correct codeword. In other words, a near-codeword differs from a correct codeword in a relatively small number of positions. For example, a near-codeword may satisfy almost all of the check nodes, except for one or two. In some embodiments, a vector may be considered a near-codeword when any suitable small number of check nodes are unsatisfied, for example, at least one check node is unsatisfied. In some embodiments a near-codeword may be referred to as trapping set and vice-versa. Near-codeword and/or trapping set detection and correction mechanisms described herein in connection with FIGS. 9-15 may apply equally to near-codewords and trapping sets.

Often time, near-codewords may be caused by "trapped errors," which are errors that the standard decoder may be unable to correct even if the decoder were able to iterate beyond the threshold number of iterations or sub-iterations. For example, a decoder may be considered to be in a trapped error state when it encounters a steady-state error wherein an incorrect value associated with a variable node and/or a check node does not change after some predetermined number of iterations. A decoder may also be considered trapped when it encounters an oscillating-state error wherein an incorrect value associated with a variable node and/or a check node changes in some periodic fashion after some predetermined number of iterations or sub-iterations. For example, a value associated with a variable node may change from 'A' to 'B', then back to 'A' and 'B', and so on periodically. An error may be considered an oscillating-state error for any number of suitable periodic values. For example, a variable node value may change from 'A' to 'B' to 'C', then back 'A', 'B', and 'C', and so on periodically. For simplicity, examples detected and corrected errors are herein are described in terms of steady-state and/or oscillating-state errors. However, it should be noted that any other suitable type of trapped error and/or trapped error state may be detected and corrected without departing from the scope of this disclosure.

Figure 9:
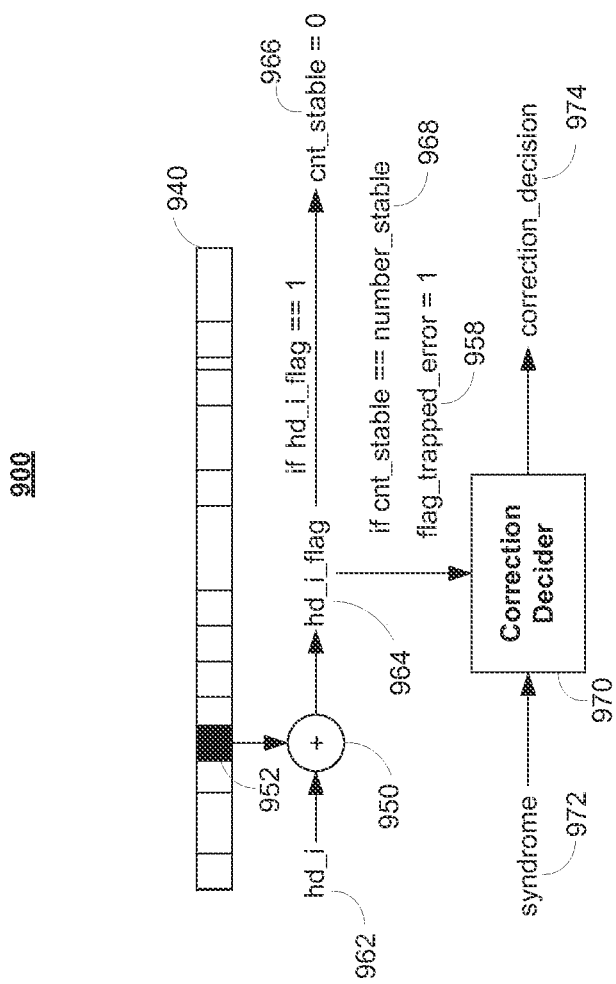
FIG. 9 shows an illustrative simplified block diagram for a trapping set detector in accordance with some embodiments.

In some embodiments, it may be possible to detect that a near-codeword has occurred during iterations and then attempt to correct the near-codeword before the threshold number of iterations occurs. For example, a near-codeword may be detected at any suitable time during a channel iteration, LDPC iteration, or a sub-iteration. FIG. 9 depicts an illustrative simplified block diagram of trapping set detector 900 for detecting, for example, steady-state and oscillating-state errors. In some embodiments, trapping set detector 900 may be included in or be in communication with an iterative decoder, for example, iterative decoder 116 of FIG. 1. Trapping set detector 900 may include hard decision memory 940 and operator 950.

In some embodiments trapping set detector 900 detects trapped errors by comparing previously computed values with newly computed values. The previously computed values may relate to variable nodes, check nodes, and/or APP message. Hard decision memory 940 may be used to store the necessary previously computed values. For example, hard decision memory 940 may store data associated with values of variable nodes 501. In some embodiments, hard decision memory 940 may additionally, or alternatively, store data associated with values of check nodes 506, where each value indicates whether the corresponding check node is currently satisfied or unsatisfied. For example, memory 940 may store the values of the variable nodes and/or check nodes after each iteration of a flooding decoder. Alternatively, memory 940 may store the values of the variable nodes and/or check nodes after each iteration of a layered decoder. Memory 940 may be any suitable memory and/or buffer and may store any suitable number of decisions. For example, memory 940 may be of the size n and may update stored hard decisions as they change, where n is any suitable value. In this scenario, before newly computed hard decisions (e.g., hard decision 962) are written in the corresponding locations (e.g., location 952) in memory 940, these newly computed hard decisions can be first compared to the current content of the locations 952 in the memory 940. If the newly computed hard decisions are different, memory 940 will update the corresponding locations with the new values. If the newly computed hard decisions are the same, memory 940 will not update the corresponding locations.

In some embodiments, memory 940 may store a predetermined or adaptable number of current and/or previous hard decisions. In some embodiments, memory 940 may store information other than hard decisions. For example, detector 900 may detect steady-state errors by comparing previously determined values of the check nodes (where value 0 indicates that the check is satisfied and value 1 indicates that the check is unsatisfied) stored in memory 940 with newly computed values of check nodes. This may be done in addition to, or alternative to, comparing previous and newly computed hard decision values.

In some embodiments, trapped error detector 900 may begin at during any suitable channel iteration, LDPC iteration, or sub-iteration. For example, when implemented in memoryless channels, detector 900 may begin attempting to detect trapped errors after the fifth or the tenth LDPC iteration. As an additional example, when implemented in channels with memories, detector 900 may begin attempting to detect trapped errors during the second channel iteration (e.g., after ten LDPC iterations, assuming there are ten LDPC iterations per channel iteration). In determining whether a trapping set exists, newly computed hard decision value 962, hd_i 962, may be compared to previously determined hard decision value 952. Previously determined hard decision value 952 may be stored in memory 940, or any other suitable location.

In some embodiments, newly computed value 962 may be compared to previously determined value 952. For example, the comparison may be made using a binary addition operation (e.g., exclusive OR operation) performed by operator 950. Operator 950 is depicted as a binary adder herein for the purposes of illustration, however, operator 950 may be any suitable form of logic that is capable of determining whether newly computed value 962 and previously determined value 952 are of equal value. It can be determined that the hard decisions have not converged to a steady output when the two values are different. Conversely, it can be determined that the hard decisions, and the respective check and/or variable nodes, are in a steady-state if the values are the same or periodically the same after some predetermined or adaptive number of iterations. In some embodiments, a flag may be set denoting whether the two values are the same. For example, hd_i_flag 964, may be set to 0 if the two values are the same and 1 if the two values are different. Flag 964 may be set in any other suitable manner.

In some embodiments, trapping set detector 900 may alternatively, or additionally, approximately detect trapped errors by determining whether the number of unsatisfied checks remain constant over multiple layers or iterations. For example, the syndrome weight may be monitored over multiple iterations. If the syndrome weight remains constant over multiple channel iterations, LDPC iterations, or sub-iterations, a steady-state error may be assumed. If syndrome weight changes periodically over multiple iterations, an oscillation-state error may be assumed.

In some embodiments, a computer, for example, cnt_stable 966, may be utilized to monitor how many stable iterations have occurred. For example, 1 may be added to cnt_stable 966 every channel iteration, LDPC iteration, or sub-iteration when all newly updated values in the current iteration are equal to the corresponding previous values in the memory 940 (e.g., hd_i_flag 964 equals 0 for all symbols whose hard decisions were updated during the current iteration). The stable values may or may not be correct values. For example, the values may converge to a correct value (e.g., the syndrome is equal to 0). Likewise, the values may converge to an incorrect value (e.g., the syndrome is not equal to 0). In some embodiments, the counter is reset to 0 when previous value 952 and newly value 962 are found to be unequal (e.g., hd_i_flag 964 equals 1). The counter may be reset to any other suitable value. In some embodiments, an error may be considered trapped if an oscillating-state error is detected over multiple layers or iterations. For example, an oscillating-state error may be considered trapped if the periodicity of the oscillating-state error remains unchanged or substantially unchanged over multiple layers or iterations. For example, cnt_stable 966 may be incremented appropriately if an error is determined to oscillate periodically.

In some embodiments, the progression through the layered or flooding decoding for a particular decision may continue until a predetermined number, for example number_stable 968, of stable iterations have been detected. For example, the decoder may halt after 10 stable iterations, if number_stable 968 equals 10. In some embodiments, the number of required iterations may vary and/or be adaptive. For example, the number may vary based on the level of noise in the communications channel and/or based on the type of decoder used (e.g., layered decoder or flooding decoder).

When the required number of steady-state iterations or oscillating-state iterations has been detected (e.g., cnt_stable 966 equals number_table 968), a flag denoting trapped error may be set, for example, flag_trapped_error 958. The value of this flag may be any suitable value. In some embodiments, number_stable 968 may be variable. For example, the value of number_stable 968 may vary based on channel conditions and/or based on type of decoder used (e.g., layered decoder or flooding decoder).

In some embodiments, number_stable 968 may be a different value with regard to steady-state errors and oscillating-state errors. In some embodiments, the value of number_stable 968 is greater than the number of sub-iterations that are performed during each LDPC iteration. For example, in layered decoding, number_stable 968 would be greater than the number of layers to, for example, avoid stopping the decoder when it is about to converge to a valid codeword. When flag_trapped_error 958 is set, any relevant counters, buffers, memories, pointers, flags, and/or any other suitable item in or associated with trapping set detector 900 may be reset. Additionally, or alternatively, any suitable counter, buffer, memory, pointer, flag, and/or any other suitable item in or associated with trapping set detector 900 may be reset at during any suitable iteration.

Trapping set detector 900 may be implemented in any suitable fashion. For example, detector 900 may be implemented in any suitable combination of software and/or hardware. For example, detector 900 may be at least partially implemented in an algorithm encoded on a computer-readable medium as computer-executable instructions. In some embodiments, detector 900 may utilize software and/or hardware present in some decoders which may be capable of handling other processes associated with the decoding process. For example, layered LDPC decoders include comparison logic that may be utilized to compare newly computed hard decisions with previously determined hard decisions in addition to other processes in the layered LDPC decoding process. In such decoders, the existing convergence logic may produce hd_i_flag 964 that may be utilized by detector 900 to detect whether an error has converged to a steady-state error or an oscillating-state error.

In some embodiments, an attempt to correct trapped errors may be made once they are detected. For example, if flag_trapped_error 958 is set (e.g., signifying that a trapped error has been found), a suitable codeword correction algorithm may be initiated. The correction algorithm may be implemented in any suitable fashion during any suitable iteration. Some embodiments of the correction algorithm are described in further detail below. In some embodiments, trapping set detector 900 may include correction decider 970. Decider 970 may decide whether the correction algorithm will be performed and/or how the correction algorithm may be performed when a trapped error is detected. For example, when a trapped error is found before or during the last iteration, the correction algorithm may attempt to correct the trapped error before the last iteration is completed. For example, if flag_trapped_error has been set and the syndrome weight (e.g., syndrome 972) is greater than 0 prior to the last iteration, then the decider 970 may decide that the correction algorithm be performed during the last iteration or sub-iteration in lieu of the subsequent iteration(s). Alternatively, if flag_trapped_error has been set, decider 970 may decide that the correction algorithm should be performed in parallel with the subsequent iteration(s).

If these algorithms are performed in parallel in subsequent iterations, in some embodiments, information stored in hard decision memory 940 from previous iterations may need to be maintained or stored in another location when performing the correction algorithm. For example, the correction algorithm may require information stored in hard decision memory 940 during iteration number 2 to successfully perform the correction algorithm. However, if the correction algorithm would be performed in parallel with iteration number 3, new information from iteration number 3 may override information from iteration number 2. To avoid possible loss of required data for the correction algorithm, some or all the information from iteration number 2 may be transferred from a location in memory 940 to another location within memory 940 or a different memory. In some embodiments, information from iteration number 3 may be stored in a different location within memory 940 or a different memory instead of in the location where information related to iteration number 2 is stored, for example, when the correction algorithm is to be performed in parallel with iteration number 3.

In some embodiments, decider 970 may output a correction decision, for example correction_decision 974, when a decision regarding whether the correction algorithm will be performed and/or how the correction algorithm may be performed has been made. In some embodiments, decider 970 may decide whether to perform the correction algorithm in parallel or in lieu of subsequent iterations based on memory availability. For example, information stored in hard decision memory 940 from previous iterations should be moved to another memory location when the decoding and correction algorithms are performed in parallel. In such embodiments, decider 970 may decide to perform the algorithms in parallel when there is a sufficient amount of available memory. Alternatively, decider 970 may decide to perform the correction algorithm in lieu of the subsequent iterations when there is an insufficient amount of available memory.

In some embodiments, a trapped error may be detected during any suitable iteration. In some embodiments, it may be beneficial if the trapped error is detected during an earlier iteration as opposed to a later iteration. For example, if there is a maximum of three iterations allowed to attempt to decode a codeword and a trapped error is detected during the second iteration, the codeword correction algorithm has the remainder of the second iteration and the complete third iteration to correct the error. As another example, if the trapped error is detected during the third iteration, the correction algorithm only has the remainder of the third iteration to correct the error.

In some embodiments, correction decider 970 may adapt a correction decision previously made if new information is made available. For example, a decision may have been made to perform the correction algorithm on a steady-state error in parallel with a subsequent iteration. However, during the subsequent iteration, the steady-state error becomes an oscillating-state error. Decider 970 may then issue a new decision regarding whether the correction algorithm will be performed and/or how the correction algorithm may be performed. Additionally, or alternatively, any adjustment regarding memory storage of previous values and newly computed values may be made when, for example, an error changes state.

In some embodiments, when the correction algorithm and regular decoding iterations are being performed in parallel, a decoder may halt the correction algorithm and/or ignore its output when the decoding iterations successfully decode the codeword before the correction algorithm corrected it. Alternatively, the decoder may halt the decoding iterations and/or ignore its output when the correction algorithm successfully corrects a codeword before the decoding iterations decode it.

Figure 10:
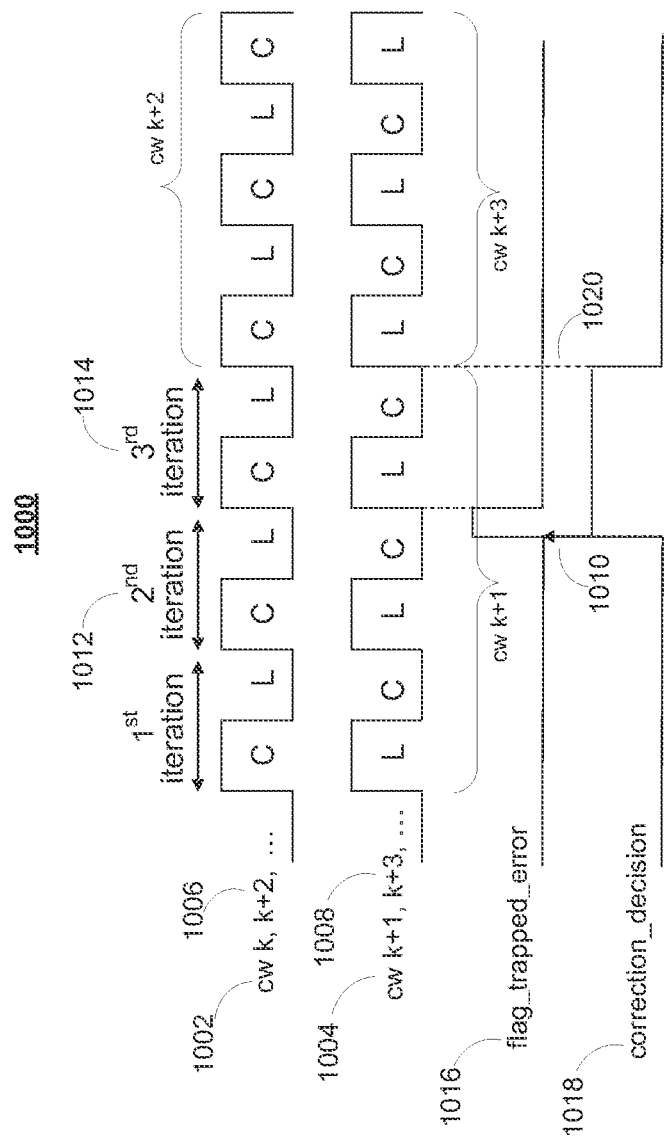
FIG. 10 shows an illustrative timing diagram when multiple codewords are decoded in parallel in accordance with some embodiments.

In some embodiments, the architecture of the iterative decoder, such as iterative decoder 116 or FIG. 1, may be designed such that two or more codewords are decoded in parallel. Such parallel iterative decoder architectures are described in Chaichanavong et al., U.S. Patent Application Publication 2009-0150746, published Jun. 11, 2009, which is hereby incorporated by reference herein in its entirety. FIG. 10 shows an illustrative timing diagram for embodiments wherein multiple codewords are decoded in parallel. Although FIG. 10 illustrates two codewords being decoded in parallel, any suitable number of codewords (e.g., one or more codeword) may be decoded during a particular time period within the scope of the embodiments described herein.

As an illustrative example, there are three channel iterations to process each codeword, for example, cw k 1002, cw k+1 1004, cw k+2 1006, and cw k+3 1008. Here, cw k 1002 and cw k+1 1004 are processed in parallel and cw k+2 1006 and cw k+3 1008 are processed in parallel during the next group of iterations. As discussed above, each channel iteration iterates between a channel detector, such as channel detector 115 of FIG. 1, and an LDPC decoder, such as LDPC decoder 117 of FIG. 1. These iterations are represented in FIG. 10 by 'C' and 'L' to represent the periods of time wherein the channel detector is processing information and wherein the LDPC decoder is processing information, respectively.

In some embodiments, a trapped error in cw k 1002 may be detected at time 1010. This trapped error may be detected at any time before third iteration 1014, however, for illustrative purposes, the error is detected near the end of second iteration 1012. This trapped error may be detected as described above with regards to trapping set detector 900 of FIG. 9. At time 1010, flag_trapped_error 1016 may be set. In some embodiments, flag_trapped_error 1016 may be substantially similar to flag_trapped_error 958 of FIG. 9. At the start of the third iteration, flag_trapped_error 1016 may be reset. Additionally, correction_decision 1018, which may be substantially similar to correction_decision 974, may be set at time 1010 to indicate that a codeword correction algorithm should be initiated. Correction_decision 1018 may remain set for the duration of the decoding of cw k 1002. In some embodiments, the correction algorithm may be performed as long as correction_decision 1018 is set and/or until the end of the final iteration (e.g., third iteration 1014). For example, the correction algorithm may be halted at time 1020 or at any earlier time, if the correction algorithm succeeds before the time 1020.

Figure 11:
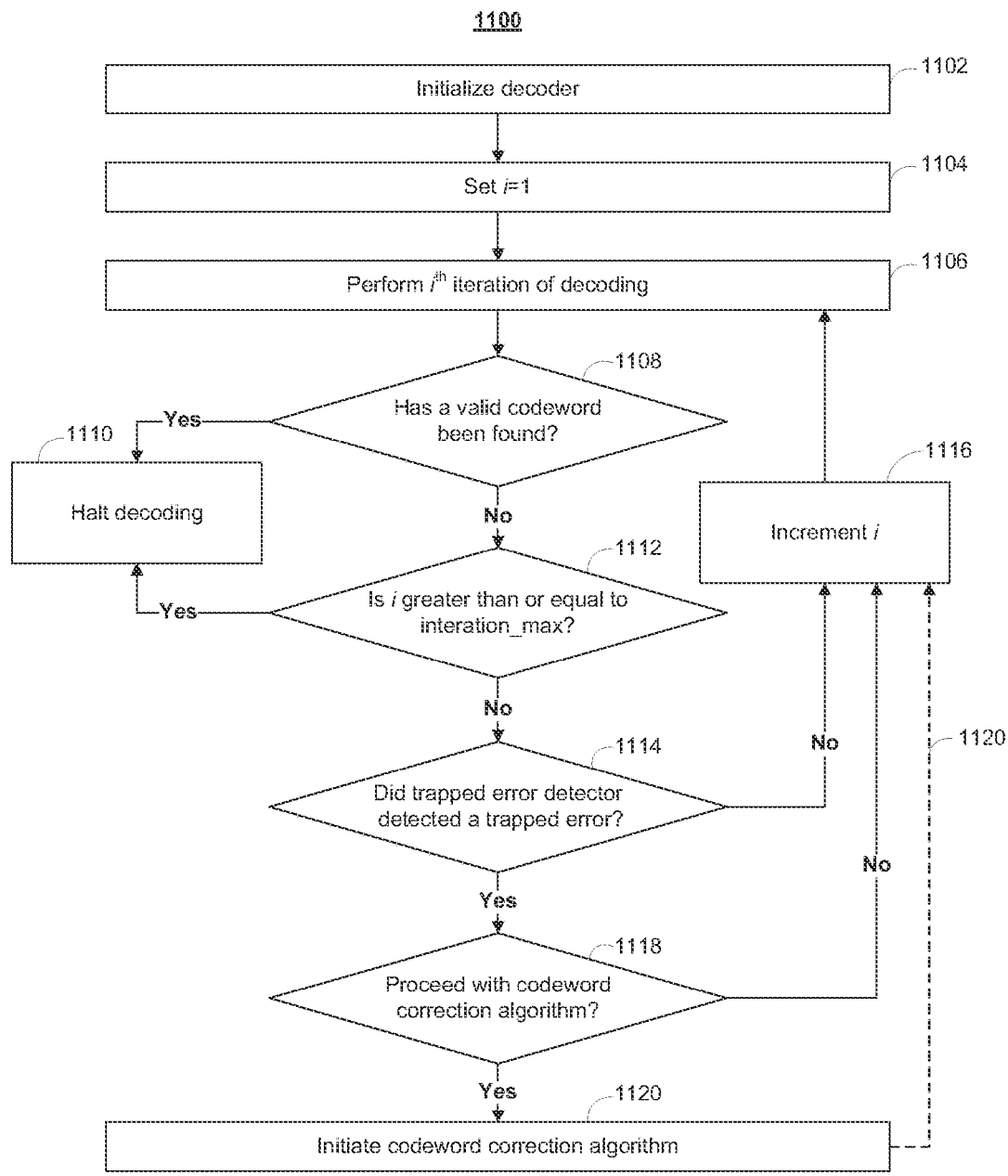
FIG. 11 shows a flowchart of a process for detecting and correcting trapped errors in accordance with some embodiments.

FIG. 11 shows illustrative process 1100 for detecting and correcting trapped errors in accordance with some embodiments. At 1102, the decoder is initialized. The decoder may be any suitable decoder, for example, iterative decoder 116 and/or LDPC decoder 117 of FIG. 1. At 1104, a counter, i, is initialized. The counter, i, may be used to track how many iterations the decoder has progressed through. For illustrative purposes, i is shown to be initialized to 1, however, i may be initialized to any other suitable value. At 1106, the $i^{th}$ iteration of the decoder is performed. The $i^{th}$ iteration may refer to a channel iteration, a LDPC iteration, or sub-iteration. At 1108, a check to determine whether a valid codeword has been found may be performed. In some embodiments, the valid codeword may or may not be the correct codeword. Instead, it may be a codeword that satisfies all the parity check nodes or any other suitable criteria for determining whether a codeword is valid. In some embodiments, it may be desirable to consider a valid codeword a true valid codeword after the minimal iterations at which syndrome weight is zero (all check nodes are satisfied). In other embodiments, a valid codeword may be considered a true valid codeword if the validity remains stable over multiple iterations.

If a valid codeword has been found, process 1100 proceeds to 1110 where decoding is halted. Decoding may be halted temporarily or permanently. For example, decoding may be halted for the current set of channel inputs, for example received vector 114 of FIG. 1, which led to the determination of the valid codeword. The decoding may be halted until another set of channel inputs and/or received vector is input into the iterative decoder, for example iterative decoder 116 of FIG. 1. If a valid codeword, or true valid codeword, has not been detected, process 1100 proceeds to 1112.

At 1112, it is determined whether i is greater than or equal to iteration_max. In some embodiments, iteration_max refers to the maximum number of channel iterations, LDPC iterations, or sub-iterations that may be performed on, for example, each received vector. In some embodiments, iteration_max refers to the maximum number of LDPC iterations or sub-iterations that may be performed per channel iteration. As described above, i may represent the number of iterations performed thus far by the decoder. If the maximum number of iterations has been performed, process 1100 proceeds to 1110, where the decoding is halted as described above. Alternatively, if the maximum number of iterations has not been performed, process 1100 proceeds to 1114.

At 1114, it is determined if a trapped error has been detected. In some embodiments, this determination may be made by trapping set detector 900 of FIG. 9 and/or a process substantially similar to process 1200 of FIG. 12, which is described in greater detail below. As described above, a trapped error may refer to a steady-state error or an oscillation-state error. If a trapped error has not been detected, the process proceeds to 1116, where i is incremented. After i is incremented, the process proceeds to 1106 to perform the next decoding iteration.

Alternatively, if a trapped error has been detected at 1114, the process proceeds to 1118. At 1118, a determination is made on whether the codeword correction algorithm is initiated. In some embodiments, this decision may be made by, for example, correction decider 970 of FIG. 9. As described above with regard to decider 970, it may determine whether the correction algorithm will be performed and/or how the correction algorithm may be performed. If process 1100 will not proceed with the correction algorithm, process 1100 proceeds to 1116, where, as described above, i is incremented.

If it is determined to proceed with the codeword correction algorithm at 1118, process 1100 proceeds to 1120. At 1120, the correction algorithm is initiated. The correction algorithm may be any suitable correction algorithm. In some embodiments, the correction algorithm may be substantially similar to the correction algorithms described below with regard to FIGS. 13-15. In some embodiments, 1120 may be performed in parallel with the decoding iterations. For example, while 1120 continues to be performed, process 1100 may additionally proceed to 1116 to increment i and continue with the iterative decoding process. In some embodiments, process 1100 may not continue the iterative decoding process and 1120 may be performed until a valid codeword is determined, the time allotted to correct the trapped error expires, and/or any other suitable correction algorithm halting point.

In practice, one or more stages shown in process 1100 may be combined with other stages, performed in any suitable order, performed in parallel (e.g., simultaneously or substantially simultaneously), or removed. For example, the correction algorithm performed at 1120 may be performed substantially simultaneously as the $i^{th}$ iteration of decoding performed at 1106. Process 1100 may be implemented using any suitable combination of hardware and/or software in any suitable fashion.

Figure 12:
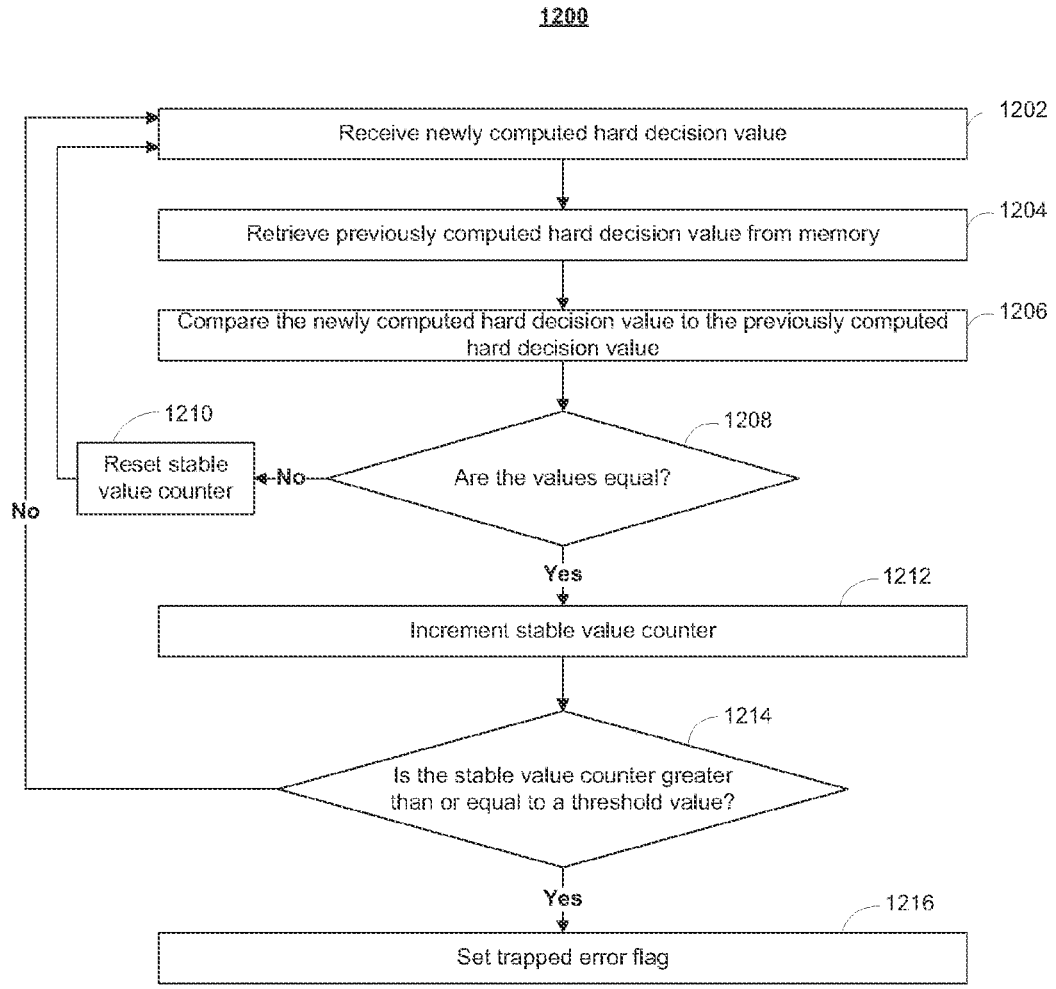
FIG. 12 shows a flowchart of a process for detecting trapped errors in accordance with some embodiments.

FIG. 12 shows illustrative process 1200 for detecting trapped errors in accordance with some embodiments. Process 1200 may be implemented using, for example, trapping set detector 900 of FIG. 9. At 1202, a newly computed hard decision is received. The newly computed hard decision may be substantially similar to newly computed hard decision value 962 of FIG. 9. At 1204, a previously computed hard decision value is retrieved from, for example, a hard decision memory. The previously computed hard decision value and hard decision memory may be substantially similar to previously determined hard decision value 952 and hard decision memory 940 of FIG. 9, respectively. It should be noted that the previously computed and newly computed values may be any suitable value as described above with regard to FIG. 9. For example, the values may be associated with variable nodes (hard decision values) and/or check nodes (check node values that indicate whether corresponding check node is satisfied or unsatisfied).

At 1206, the newly computed and previously computed hard decision values are compared. Operator 950 of FIG. 9 or any other suitable comparison software or hardware may complete the comparison as discussed above with regard to FIG. 9. At 1208, it is determined whether the two values are equal. If the two values are not equal, a steady-state error has not been detected. In some embodiments, the comparison may be made between the newly computed value and value computed more than one iteration prior to the current iteration. This may allow for the detection of oscillation-state errors. If the two values are not equal, an oscillation-state error may have not been detected as well. If no trapping error is detected at 1208, process 1200 proceeds to 1210 where a stable value counter is reset. The stable value counter may be substantially similar to cnt_stable 966 of FIG. 9. For example, the stable value counter may be incremented every iteration where all the newly computed values (e.g., those computed during the current iteration) are equal to the previously computed values corresponding to the same symbol and/or check locations. After resetting the stable value counter at 1210, process 1200 proceeds back to 1202 to continue the trapped error detection process.

If the newly computed and previously computed values are determined to be equal at 1208, process 1200 proceeds to 1212 where the stable value counter is incremented by any suitable value. At 1214, it is determined whether the stable value counter is greater than or equal to a threshold value. The threshold value may represent the number of stable iterations necessary for an error to be considered a trapped error. The threshold value may be substantially similar to number_stable 968 of FIG. 9. If the stable value counter is less than the threshold value, process 1200 proceeds back to 1202 to continue the trapped error detection process.

If the stable value counter is determined to be greater than or equal to the threshold value at 1214, then process 1200 proceeds to 1216 where a trapped error flag is set. Trapped error flag may be substantially similar to flag_trapped_error 958 of FIG. 9. In some embodiments, the flag's value may be sent to a correction decider to determine whether the correction algorithm will be performed and/or how the correction algorithm may be performed.

In practice, one or more stages shown in process 1200 may be combined with other stages, performed in any suitable order, performed in parallel (e.g., simultaneously or substantially simultaneously), or removed. For example, the newly computed hard decision value of 1202 and the previously computed hard decision value of 1204 may be received and retrieved substantially simultaneously. Process 1200 may be implemented using any suitable combination of hardware and/or software in any suitable fashion.

Figure 13:
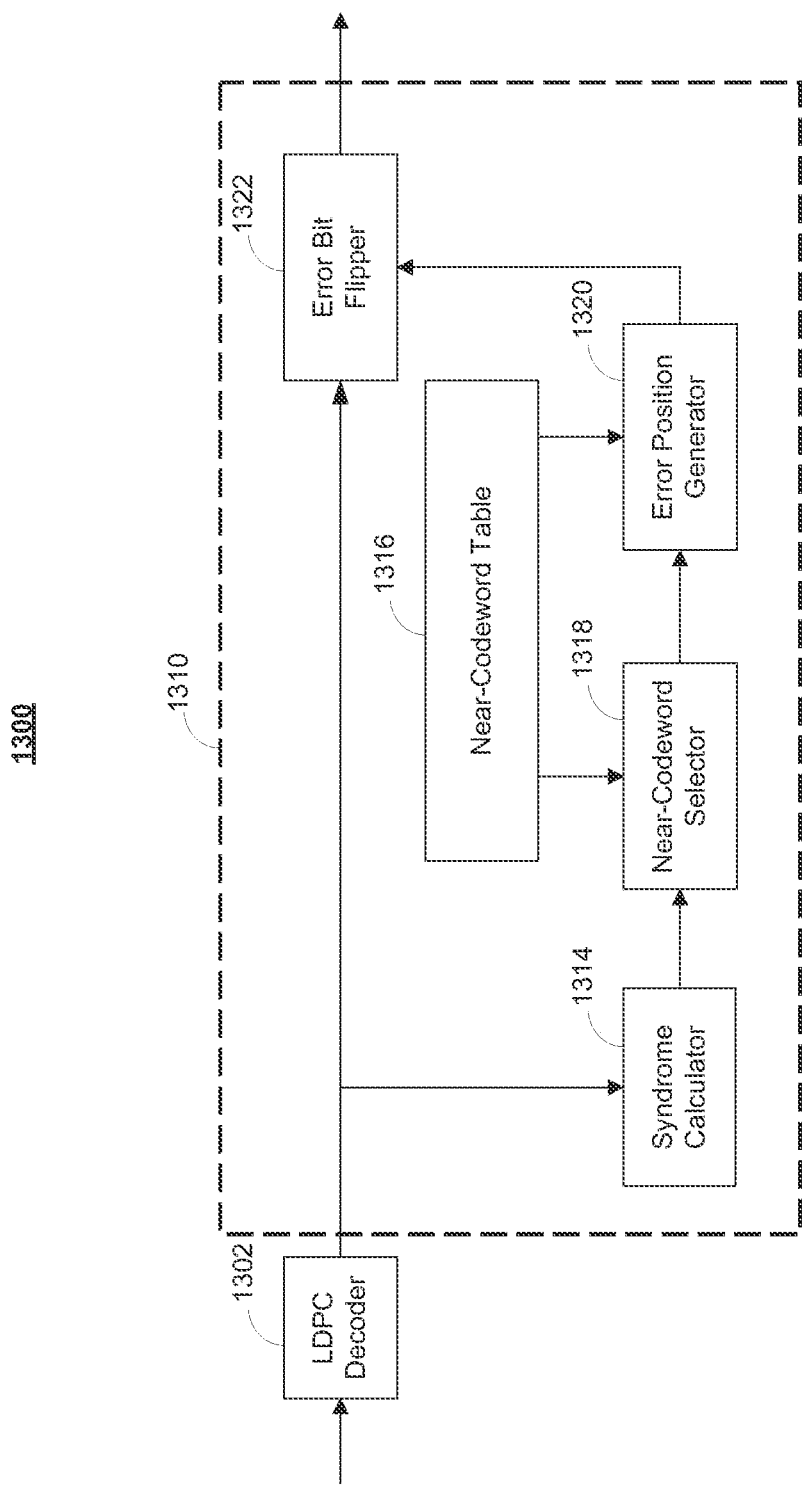
FIG. 13 shows an illustrative simplified block diagram for a near-codeword corrector in accordance with some embodiments.

FIG. 13 depicts an illustrative simplified block diagram 1300 with near-codeword corrector 1310 for correcting, for example, near-codewords detected in trapping set detector 900 of FIG. 9. Near-codeword corrector 1310 may include syndrome calculator 1314, near-codeword table 1316, near-codeword selector 1318, error position generator 1320, and error bit flipper 1322. In some embodiments, near-codeword corrector 1310 may be included in or be in communication with an iterative decoder, for example, iterative decoder 116 of FIG. 1.

In some embodiments, LDPC decoder 1302, which may be substantially similar to LDPC decoder 117 of FIG. 1, may pass a newly decoded near-codeword to near-codeword corrector 1310. Decoder 1302 may pass the newly decoded near-codeword to corrector 1310 when, for example, a correction decider issues a decision to attempt to correct the near-codeword during an iterative decoding process. The correction decider may be substantially similar to correction decider 970 of FIG. 9. In some embodiments, the near-codeword may be passed from decoder 1302 to syndrome calculator 1314. In some embodiments, calculator 1314 may calculate the syndrome weight of the newly decoded near-codeword, determine which circulants are associated with the error or errors in the near-codeword, and/or determine any other suitable information necessary to correct the error or errors in the newly decoded near-codeword. Upon determining any information necessary to attempt to correct the near-codeword, calculator 1314 may output the determined information to near-codeword selector 1318.

In some embodiments, near-codeword corrector 1310 may compare information determined in syndrome calculator 1314 to information stored in near-codeword table 1316 using near-codeword selector 1318. For example, selector 1318 may compare the syndrome weight of the newly detected near-codeword to a syndrome weight of a previously known near-codeword stored in table 1316. If selector 1318 finds a match in syndrome weights, selector 1318 may then attempt to find a match in syndrome circulants where the error or errors occurred in the newly detected near-codeword.

In some embodiments, the newly detected near-codeword and previously known near-codeword may be determined to match when the syndrome circulants and/or check nodes associated with the errors in the previously known near-codeword have a shift relationship to the errors in the newly detected near-codeword. The shift relationship may be due to the quasi-cyclic nature of an LDPC parity check matrix. For example, the quasi-cyclic structure of an LDPC matrix may create symmetry in the matrix, for example, between rows of the matrix. For example, errors in a previously known near-codeword may have been associated with check nodes 0 and 63 of circulants 0 and 1, respectively. If errors in the newly detected near-codeword are associated with check nodes 5 and 68 of circulants 0 and 1, respectively, the newly detected near-codeword may be considered a match with a 5-node shift to the aforementioned previously known near-codeword. In some embodiments, selector 1318 may complete this determination.

In some embodiments, selector 1318 may attempt to find a match between the newly detected near-codeword and previously known near-codewords using any suitable data and/or method. Upon finding a match between a newly detected near-codeword and a previously known near-codeword stored in table 1316, selector 1318 may output information related to the match to error position generator 1320. For example, selector 1318 may output the memory and/or table location of the matched near-codeword in table 1316, check node shift information, and/or any other suitable relevant information associated with the matched near-codewords.

In some embodiments, near-codeword table 1316 may store information related to previously known near-codewords which may be utilized to correct newly detected near-codewords (e.g., near-codewords that had been encountered in prior iterations), for example, by near-codeword selector 1318 and error position generator 1320. Table 1316 may be any suitable term of memory or buffer that stores information which may be utilized to correct near-codewords. In some embodiments, if the newly detected near-codeword passed from decoder 1302 matches one of the entries stored in table 1316, corrector 1310 may be able to utilize the information in table 1316 to flip appropriate bits in the near-codeword to correct the error or errors in the near-codeword. In some embodiments, flipping the appropriate bits transforms the near-codeword into a valid codeword (e.g., a codeword that satisfies all LDPC check nodes).

In some embodiments, near-codeword table 1316 may store syndrome weights associated with previously known near-codewords, syndrome and bit circulants associated with the error or errors in the respective known near-codewords, check nodes and variable nodes associated with the error or errors in the respective known near-codewords, and any other suitable information that may be utilized to correct near-codewords. In some embodiments, the first syndrome circulants, bit circulants, check nodes, and/or variable nodes may be represented as a 0. This may allow table 1316 to avoid storing some information related to the first syndrome circulants, bit circulants, check nodes, and/or variable nodes and may reduce the amount of storage space required by table 1316. The information associated with the known near-codewords may be stored in any suitable order, for example, an order that substantially maximizes the speed and efficiency of operation of near-codeword corrector 1310. For example, substantially dominant, substantially common, and/or substantially important known near-codewords may be stored near the top of table 1316 so that they would be encountered relatively early during the matching search performed by near-codeword selector 1318. Conversely, less dominant, less common, and/or less important known near-codewords may be stored in a location in table 1316 that would be accessed later during the search conducted by selector 1318.

In some embodiments, information stored in near-codeword table 1316 may be predetermined. Additionally, the information stored in table 1316 may be fixed or may be adaptive. For example, during normal operation of an iterative decoder, new near-codewords may be discovered and/or previously known near-codewords may be determined to be more or less dominant, common, and/or important. Newly discovered and/or corrected near-codewords may be added to table 1316 in any suitable location. The storage location in table 1316 of previously known near-codewords that are determined to be more or less dominant, common, and/or important may be shifted within table 1316 to account for their newly determined relevancy. For example, if a previously known near-codeword is determined to be less dominant than previously determined, information associated with the previously known near-codeword may be moved to a location in table 1316 that would be searched later during the matching process performed by selector 1318. In some embodiments, previously known near-codewords may be removed entirely from table 1316 when determined to be less dominant, common, and/or important.

In some embodiments, architectures that allow processing of multiple near-codewords simultaneously may additionally increase performance of the correction process of the iterative decoder. For example, near-codeword selector 1318 may be capable of searching through a greater number of near-codewords in near-codeword table 1316 if the near-codeword corrector is implemented with a parallel type architecture. For example, the near-codeword correction processing performance of the decoder may increase by a multiple of the parallelization. For example, the near-codeword corrector may process a table of p*L near-codewords in M clock cycles. Here, M is any suitable number of clock cycle, p represents the parallelization, and L represents the number of near-codewords that the near-codeword corrector may process in M clock cycles when there is no parallelization.

In some embodiments, near-codeword corrector 1310 may include, operate substantially simultaneously with, and/or operate in conjunction with additional software and/or hardware for correcting near-codewords. In some embodiments, these additional correcting processes (which are typically slower than the on-the-fly near-codeword corrector described above) may be used to correct previously unknown near-codewords. In some embodiments, these additional correcting processes may utilize bit-quessing algorithms to correct previously unknown near-codewords, however, any other suitable method for correcting previously unknown near-codewords may be used. The additional correction algorithm may then provide information relevant to correcting the previously unknown near-codeword to corrector 1310 for storage and/or updating to near-codeword table 1316. For example, the additional correcting processes may provide relevant syndrome weight, syndrome circulant, variable circulant, check node, and/or variable node information to table 1316. Corrector 1310 may then utilize the provided information from the additional correcting processes to correct the near-codeword if it is encountered again in future received vectors. For example, for near-codewords that are not present in table 1316, the additional correcting process may be able to correct such near-codewords. Then the additional correcting process can provide information regarding which bits to flip in order to transform the near-codeword to a valid codeword to corrector 1310. Corrector 1310 may then add this and any other relevant information to table 1316 for later use. Therefore, in subsequent received vectors, if such a near-codeword re-occurs, the near-codeword corrector will be able to correct this near-codeword on-the-fly. In some embodiments, a large near-codeword table 1316 may increase the performance of corrector 1310 when compared to smaller tables. In some embodiments, it is not necessary to rerun an iterative decoder when utilizing corrector 1310. An illustrative example of the contents of table 1316 is discussed further below with regard to FIG. 14.

If near-codeword selector 1318 detects one or more matches between the newly decoded near-codeword from LDPC decoder 1302 and a previously known near-codeword(s) in table 1316 as described above, selector 1318 may pass information regarding the detected match to error position generator 1320. For example, selector 1318 may output the memory and/or table location of the matched near-codeword in table 1316, check node shift information, and/or any other suitable relevant information associated with the matched near-codewords. Additionally, selector 1318 may provide generator 1320 with information related to the newly detected near-codeword. For example, the information related to the error or errors in the newly detected near-codeword that were calculated by calculator 1314 may be provided to generator 1320. Generator 1320 may utilize the information provided by selector 1318 to gather any necessary information from table 1316. For example, generator 1320 may gather information regarding the variable circulants and/or variable nodes that are associated with the errors of the previously known matched near-codeword from table 1316.

In some embodiments, error position generator 1320 may utilize the information provided by near-codeword table 1316 and near-codeword selector 1318 to determine which bit locations within the near-codeword should be flipped to attempt to correct the near-codeword. For example, generator 1320 may utilize memory and/or table location from selector 1318 of the matched near-codeword in table 1316 to retrieve related variable circulant and/or variable node information. For example, related variable circulant and/or variable node information may be information regarding in which variable circulants and variable nodes an error or errors occurred in the matched near-codeword. In some embodiments, generator 1320 may determine that flipping bits in the near-codeword associated with the variable nodes in which errors occurred, as determined from information in table 1316, may correct the near-codeword.

In some embodiments, selector 1318 may output information to generator 1320 that indicates that there is a shift relationship between the matched near-codeword in table 1316 and the newly detected near-codeword, as described above. When there is a shift relationship between the matched near-codeword and newly detected near-codeword, generator 1320 may determine the shift relationship between variable nodes of the matched near-codeword and the newly detected near-codeword. For example, if there is a node shift relationship between check nodes of the matched near-codeword and the newly detected near-codeword, there may be an equal node shift between variable nodes of the matched near-codeword and the newly detected near-codeword.

For example, errors in a previously known near-codeword may have been associated with check nodes 0 and 63 of circulants 0 and 1, respectively. If errors in the newly detected near-codeword are associated with check nodes 5 and 68 of circulants 0 and 1, respectively, the two codewords may be considered matched with a 5-node cyclic-shift relationship. If shift was 0, table 1316 may indicate that bits in the matched near-codeword associated with variable nodes 1, 2, 7, 13, and 20 of variable circulants 0, 2, 10, 43, and 87, respectively, should be flipped in order to correct the matched near-codeword. Generator 1320 may in turn utilize information associated with the determined shift relationship, as determined by, for example, near-codeword selector 1318, to apply an equal shift to the indicated variable nodes associated with the matched near-codeword in table 1316. For example, generator 1320 may apply the cyclic-shift relationship when determining which bits of the newly detected near-codeword to flip. For example, generator 1320 would determine that variable nodes 1, 2, 7, 13, and 20 of the previously known near-codeword are substantially equivalent to variable nodes 6, 7, 12, 18, and 25 in the newly detected near-codeword by applying the determined 5-node cyclic-shift relationship. As such, generator 1320 may indicate that bits associated with variable nodes 6, 7, 12, 18, and 25 should be flipped to correct the error or errors in the newly detected near-codeword.

In some embodiments, generator 1320 may determine that it is necessary to flip the bits associated with the substantially equivalent variable nodes of the newly detected near-codeword. For example, generator 1320 may determine that bits in the newly detected near-codeword associated with variable nodes 6, 7, 12,18, and 25 of circulants 0, 2, 10, 43, and 87, respectively, should be flipped to attempt to correct the newly detected near-codeword. In some embodiments, once generator 1320 determines which bits of the newly detected near-codeword to flip, generator 1320 may output the determined locations to error bit flipper 1322. Flipper 1322, may then in turn, flip the appropriate bits of the newly detected near-codeword received from LDPC decoder 1302 based on the bit locations received from generator 1320 to correct the near-codeword. Once flipper 1322 flips the appropriate bits, the corrected near-codeword may now be a valid codeword and is output from near-codeword corrector 1310 appropriately.

In some embodiments, the corrected near-codeword may be sent back to LDPC decoder 1302 or any other suitable element to verify that the corrected near-codeword is a valid codeword. For example, decoder 1302 may verify that the corrected near-codeword satisfies all the parity check conditions. In some embodiments, if the corrected near-codeword does not satisfy the parity check conditions or is in some other way determined not to be a valid codeword, the invalid corrected codeword may be sent back to LDPC decoder 1302 for further iterations and/or sent back to corrector 1310 to further attempt to correct the near-codeword.

FIG. 14 depicts an illustrative sample of table 1400 associated with information related to known near-codewords, which may be stored in, for example, near-codeword table 1316 of FIG. 13. Table 1400 may contain any suitable information that may be utilized in correcting near-codewords. In some embodiments, table 1400 may be substantially similar to data stored in table 1316, as discussed above with regard to FIG. 13. In some embodiments, table 1400 may include syndrome weight 1402, syndrome pattern information 1404, and bit pattern information 1410.

In some embodiments, table 1400 may be organized according to syndrome weight, however, any other suitable organization of table 1400 may be used. In some embodiments, syndrome pattern information 1404 may include syndrome circulant data 1406 and check node data 1408. Syndrome circulant data 1406 corresponds to a syndrome circulant or circulants that are associated with the error or errors in the related known near-codeword. Check node data 1408 corresponds to a check node or nodes within the corresponding circulants. These check nodes are associated with the error or errors in the related known near-codeword.

In some embodiments, bit pattern information 1410 may include variable circulant data 1412 and variable node data 1414. Variable circulant data 1412 corresponds to a variable circulant or circulants that are associated with the error or errors in the related known near-codeword. Variable node data 1414 corresponds to a variable nodes' position within the corresponding circulants. These variable nodes are associated with the error or errors in the related known near-codeword. In some embodiments, bits in a newly detected near-codeword that is determined to match a near-codeword represented in table 1400 may be flipped based on, for example, variable node data 1414, as discussed above with regard to error position generator 1320 and error bit flipper 1322 of FIG. 13. In some embodiments, the bits in a newly detected near-codeword may be flipped based on a node shift relationship between the newly detected near-codeword and a previously known near-codeword represented in table 1400, as discussed above with regard to FIG. 13.

Figure 15:
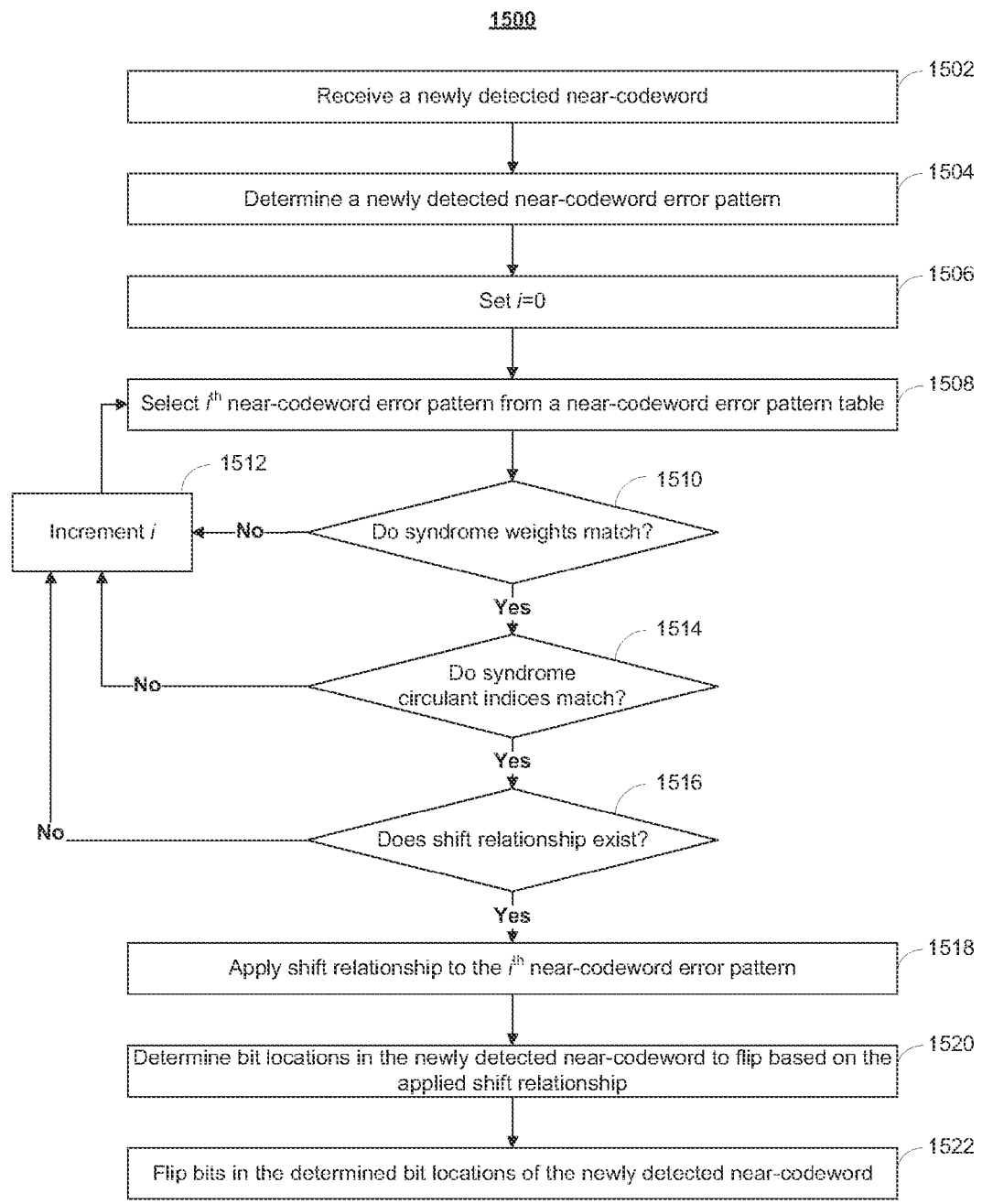
FIG. 15 shows a flowchart of a process for correcting near-codewords in accordance with some embodiments.

FIG. 15 shows illustrative process 1500 for correcting near-codewords in accordance with some embodiments. Process 1500 may be implemented using, for example, near-codeword corrector 1310 of FIG. 13. At 1502, a newly detected near-codeword is received. The newly detected near-codeword may be received from, for example, LDPC decoder 1302 of FIG. 13. At 1504, an error pattern associated with the newly detected near-codeword is determined. The error pattern determination may be completed using, for example, syndrome calculator 1314 of FIG. 13. The error pattern may include information regarding the syndrome weight of the newly detected near-codeword, a syndrome pattern substantially similar to syndrome pattern information 1404 of FIG. 14. For example, the syndrome pattern may include information regarding the syndrome circulants and check nodes within the circulants associated with the error or errors in the newly detected near-codeword.

At 1506, a counter is initialized. For example, counter i is initialized to 0. At 1508, the $i^{th}$ near-codeword error pattern is selected from a near-codeword error pattern table. For example, the near-codeword error pattern table may be substantially similar to near-codeword table 1316 of FIG. 13 and the near-codeword error pattern may be substantially similar to the data stored in table 1316. For example, the error patterns in the error pattern table may be error patterns associated with previously known near-codewords.

At 1510, it is determined whether the syndrome weights from the newly detected near-codeword error pattern and $i^{th}$ near-codeword error pattern match. When the syndrome weights do not match, process 1500 proceeds to 1512, where i is incremented by any suitable value. After incrementing i, process 1500 proceeds back to 1508 to evaluate the next suitable near-codeword error pattern to evaluate for a match to the newly detected near-codeword error pattern. In some embodiments, i may be incremented such that the next error pattern evaluated has a different syndrome weight than the previous error pattern evaluated. For example, there may be x error patterns in the error pattern table that have a syndrome weight of 2. If it is determined that the syndrome weight of the newly detected error pattern is different than 2, then i may be incremented so that the next error pattern from the error pattern table evaluated has a syndrome weight other than 2.

If the syndrome weights do match at 1510, then process 1500 proceeds to 1514. At 1514, it is determined whether the syndrome circulant indices of the newly detected near-codeword error pattern and the $i^{th}$ near-codeword error pattern match. For example, errors in the newly detected near-codeword and the $i^{th}$ near-codeword error pattern may be associated with syndrome circulant indices 0 and 1 in both the newly detected near-codeword error pattern and the $i^{th}$ near-codeword error pattern. Here, the syndrome circulant indices may be considered a match. If the syndrome circulant indices do not match, process 1500 proceeds to 1512 where i is incremented as discussed above. When the syndrome circulant indices do match, process 1500 proceeds to 1516. Syndrome circulant indices represent to which syndrome circulant is being referred.

At 1516, it is determined whether a cyclic-shift relationship exists between the newly detected near-codeword error pattern and the $i^{th}$ near-codeword error pattern. For example, a cyclic-shift relationship may exist between check nodes of the newly detected near-codeword error pattern and the $i^{th}$ near-codeword error pattern. For example, as discussed above with regard to near-codeword selector 1318 of FIG. 13, the new error pattern and the $i^{th}$ error pattern may be considered a match if errors associated with the new error pattern's check nodes are of equal spacing within the respective circulant, only equally cyclically shifted to different check nodes. For example, errors associated with check nodes 5 and 68 of circulant 0 in the new error pattern may be considered a match to the $i^{th}$ error pattern when errors are associated with check nodes 0 and 63 of circulant 0 in the $i^{th}$ error pattern and when the syndrome weights match between the two error patterns. Here, the two error patterns match with a 5-node cyclic-shift relationship. In some embodiments, the shift relationship may be determined to be 0 indicating, for example, that the check nodes in the two error patterns are equal. In some embodiments, the matching determinations made at 1510, 1514, and/or 1516 may be implemented using, for example, syndrome calculator 1314, near-codeword selector 1316, and/or error position generator 1320, respectively, each of FIG. 13. If no shift relationship exists, process 1500 proceeds to 1512 where i is incremented as discussed above. When a shift relationship does exist, process 1500 proceeds to 1518.

At 1518, the cyclic-shift relationship determined at 1516 is applied to the $i^{th}$ near-codeword symbol error pattern. For example, an equivalent symbol error pattern may be determined based on cyclically shifted positions of variable nodes associated with errors in a previously known near-codeword that is associated with the $i^{th}$ near-codeword error pattern. In some embodiments, an equivalent error pattern is not determined, but instead only the positions of the cyclically shifted variable nodes are determined. Here, the positions of the variable nodes may be cyclically shifted according to the shift relationship determined at 1516. For example, if a 5-node cyclical shift relationship is determined at 1516 for variable nodes 1, 2, 7, 13, and 20 of a previously known error pattern, the shifted variable nodes 6, 7, 12, 18, and 25 may be determined at 1518. After applying the shift relationship to the $i^{th}$ near-codeword error pattern, process 1500 proceeds to 1520.

At 1520, a bit location or locations in the newly detected near-codeword to flip is determined. For example, the bit location or locations may be associated with the shifted variable nodes as determined at 1518. In some embodiments, 1518 and 1520 may be implemented using, for example, error position venerator 1320 of FIG. 13. After determining appropriate bit locations of bits to flip, the bits in the determined locations are flipped at 1522. The flipping of the bits may be implemented using, for example, error bit flipper 1322 of FIG. 13. In some embodiments, by flipping the bits in the determined locations, the newly detected near-codeword may be corrected to a valid codeword.

In practice, one or more stages shown in process 1500 may be combined with other stages, performed in any suitable order, performed in parallel (e.g., simultaneously or substantially simultaneously), or removed. For example, determining whether syndrome circulant indices match at 1514 and determining whether a cyclical shift relationship exists at 1516 may be computed substantially simultaneously. Process 1500 may be implemented using any suitable combination of hardware and/or software in any suitable fashion.

The above described embodiments of the present discloser are presented for purposes of illustration and not of limitation, and the present disclosure is limited only by the claims which follow.

What is claimed is:

1. A method for correcting near-codewords, the method comprising:
   receiving a near-codeword;
   determining an error pattern associated with the near-codeword;
   comparing the determined error pattern to a known error pattern to determine whether a shift relationship exists between the determined error pattern and the known error pattern; and
   adjusting a value of a symbol in a symbol location in the near-codeword, wherein the symbol location is determined based on the shift relationship between the determined error pattern and the known error pattern when the shift relationship exists.

2. The method of claim 1, wherein the symbol is one of binary, ternary or quaternary.

3. The method of claim 1, further comprising maintaining a table containing a plurality of known error patterns associated with a plurality of known near-codewords.

4. The method of claim 1, wherein the known error pattern comprises patterns associated with at least one of syndrome weights, syndrome circulants, variable circulants, check nodes, and variable nodes.

5. The method of claim 1, wherein comparing the error pattern comprises:
   comparing a first syndrome weight of the determined error pattern to a second syndrome weight of the known error pattern.

6. The method of claim 1, wherein comparing the error pattern comprises:
   comparing a first syndrome circulant data associated with a first error in the determined error pattern to a second syndrome circulant data associated with a second error in the known error pattern.

7. The method of claim 1, further comparing the determined error pattern to a different known error pattern when no shift relationship exists.

8. The method of claim 1, wherein the near-codeword is received when a decoder is determined to be in a trapped error state.

9. The method of claim 8, wherein the decoder is determined to be in the trapped error state based on a comparison of the received near-codeword with a previously received codeword.

10. The method of claim 1, wherein determining the shift relationship comprises:
    determining a shift value between a first check node associated with a first error in the determined error pattern and a second check node associated with a second error in the known error pattern.

11. The method of claim 10, wherein determining the symbol location comprises:
    shifting a first variable node associated with the known error pattern by the shift value, and
    determining the symbol location in the near-codeword associated with the shifted first variable node.

12. A system for correcting near-codewords, the system comprising:
    a receiver configured to receive a near-codeword;
    a calculator configured to determine an error pattern associated with the near-codeword;
    a selector configured to compare the determined error pattern to a known error pattern to determine whether a shift relationship exists between the determined error pattern and the known error pattern; and
    an error adjuster configured to adjust a value of a symbol in a symbol location in the near-codeword, wherein the symbol location is determined based on the shift relationship between the determined error pattern and the known error pattern when the shift relationship exists.

13. The system of claim 12, wherein the symbol is one of binary, ternary or quaternary.

14. The system of claim 12, further comprising memory configured to store a plurality of known error patterns associated with a plurality of known near-codewords.

15. The system of claim 12, wherein the known error pattern comprises patterns associated with at least one of syndrome weights, syndrome circulants, variable circulants, check nodes, and variable nodes.

16. The system of claim 12, wherein the selector is further configured to:
    compare a first syndrome weight of the determined error pattern to a second syndrome weight of the known error pattern.

17. The system of claim 12, wherein the selector is further configured to:
    compare a first syndrome circulant data associated with a first error in the determined error pattern to a second syndrome circulant data associated with a second error in the known error pattern.

18. The system of claim 12, further comparing the determined error pattern to a different known error pattern when no shift relationship exists.

19. The system of claim 12, wherein the receiver receives the near-codeword when a decoder is determined to be in a trapped error state.

20. The system of claim 19, wherein the decoder is determined to be in the trapped error state based on a comparison of the received near-codeword with a previously received codeword.

21. The system of claim 12, further comprising an error position generator configured to determine a shift value between a first check node associated with a first error in the determined error pattern and a second check node associated with a second error in the known error pattern.

22. The system of claim 21, wherein the error position generator is further configured to determine the symbol location in the near-codeword associated with the shift value.

23. A method for correcting near-codewords, the method comprising:
   receiving a near-codeword;
   determining an error pattern associated with the near-codeword;
   comparing the determined error pattern to a known error pattern to determine whether a shift relationship exists between the determined error pattern and the known error pattern; and
   adjusting a value of a symbol in a symbol location in the near-codeword based on the determined error pattern, the symbol location being determined based on the shift relationship between the determined error pattern and the known error pattern when the shift relationship exists.

24. The method of claim 23, wherein the symbol is one of binary, ternary or quaternary.

25. The method of claim 23, further comparing the determined error pattern to a different known error pattern when no shift relationship exists.

26. The method of claim 23, wherein determining the shift relationship comprises:
   determining a shift value between a first check node associated with a first error in the determined error pattern and a second check node associated with a second error in the known error pattern.

27. The method of claim 26, wherein determining the symbol location comprises:
   shifting a first variable node associated with the known error pattern by the shift value, and
   determining the symbol location in the near-codeword associated with the shifted first variable node.

28. The method of claim 23, further comprising:
   comparing a first syndrome weight of the determined error pattern to a second syndrome weight of a known error pattern.

29. The method of claim 23, further comprising:
   comparing a first syndrome circulant data associated with a first error in the determined error pattern to a second syndrome circulant data associated with a second error in a known error pattern.

30. A system for correcting near-codewords, the system comprising:
   a receiver configured to receive a near-codeword;
   a calculator configured to determine an error pattern associated with the near-codeword;
   a selector configured to compare the determined error pattern to a known error pattern to determine whether a shift relationship exists between the determined error pattern and the known error pattern; and
   an error adjuster configured to adjust a value of a symbol in a symbol location in the near-codeword based on the determined error pattern, the symbol location being determined based on the shift relationship between the determined error pattern and the known error pattern when the shift relationship exists.

31. The system of claim 30, wherein the symbol is one of binary, ternary or quaternary.

32. The system of claim 30, further comparing the determined error pattern to a different known error pattern when no shift relationship exists.

33. The system of claim 30, further comprising an error position generator configured to determine a shift value between a first check node associated with a first error in the determined error pattern and a second check node associated with a second error in the known error pattern.

34. The system of claim 33, wherein the error position generator is further configured to determine the symbol location in the near-codeword associated with the shift value.

35. A system of claim 30, further comprising:
   a selector configured to compare a first syndrome weight of the determined error pattern to a second syndrome weight of a known error pattern.

36. A system of claim 30, further comprising:
   a selector configured to compare a first syndrome circulant data associated with a first error in the determined error pattern to a second syndrome circulant data associated with a second error in the known error pattern.

* * * * *